US012581622B2

(12) United States Patent
Pokharna et al.

(10) Patent No.: US 12,581,622 B2
(45) Date of Patent: Mar. 17, 2026

(54) METALLIC THERMAL INTERFACE MATERIALS AND ASSOCIATED DEVICES, SYSTEMS, AND METHODS

(71) Applicant: Deeia Inc., Saratoga, CA (US)

(72) Inventors: Himanshu Pokharna, Saratoga, CA (US); Gin Hwee Tan, New Taipei (TW)

(73) Assignee: Deeia Inc., Saratoga, CA (US)

( * ) Notice: Subject to any disclaimer, the term of this patent is extended or adjusted under 35 U.S.C. 154(b) by 197 days.

(21) Appl. No.: 18/212,623

(22) Filed: Jun. 21, 2023

(65) Prior Publication Data

US 2023/0363112 A1 Nov. 9, 2023

Related U.S. Application Data

(63) Continuation-in-part of application No. 17/879,630, filed on Aug. 2, 2022, now Pat. No. 12,004,324, and
(Continued)

(51) Int. Cl.
*H05K 7/20* (2006.01)
*F28F 13/00* (2006.01)

(52) U.S. Cl.
CPC ...... *H05K 7/2039* (2013.01); *F28F 2013/001* (2013.01); *F28F 2255/06* (2013.01)

(58) Field of Classification Search
CPC .............. H05K 7/2039; F28F 2013/001; F28F 2255/06; H01L 23/3672; H01L 23/3736;
(Continued)

(56) References Cited

U.S. PATENT DOCUMENTS 4,903,761 A 2/1990 Cima
5,070,788 A 12/1991 Carisella et al.
(Continued)

FOREIGN PATENT DOCUMENTS

EP 2552182 A1 1/2013
EP 2238400 B1 2/2018
(Continued)

OTHER PUBLICATIONS

Ayel, V., et al. "Experimental Study of a Closed Loop Flat Plate Pulsating Heat Pipe Under a Varying Gravity Force," International Journal of Thermal Sciences, vol. 96, 2015, 25 pages.
(Continued)

*Primary Examiner* — Michael C Zarroli
(74) *Attorney, Agent, or Firm* — WORKMAN NYDEGGER

(57) ABSTRACT

A heat-transfer component defines a thermal-interface surface and has a composite thermal-interface material bonded to the thermal-interface surface. The composite thermal-interface material comprises a particulate filler material dispersed within a metallic carrier material having a solid-to-liquid phase-change temperature between about 60° C. and about 90° C. With a thermal-interface material bonded to the thermal-interface surface, the thermal-contact resistance between the thermal-interface material and the heat-transfer component can be reduced or substantially eliminated compared to conventional thermal-interface materials, including conventional metallic thermal-interface materials. The particulate filler material can have a higher bulk thermal conductivity than that of the metallic carrier material and can be wetted by the metallic carrier material, providing a bulk thermal conductivity of the composite thermal-interface material that is higher than that of the carrier material without the particulate filler material. Also disclosed are electrical devices having a heat generating component cooled by such a heat-transfer component.

27 Claims, 19 Drawing Sheets

Related U.S. Application Data a continuation-in-part of application No. 17/520,597, filed on Nov. 5, 2021, now Pat. No. 11,744,044.

(60) Provisional application No. 63/485,925, filed on Feb. 19, 2023, provisional application No. 63/354,175, filed on Jun. 21, 2022, provisional application No. 63/110,335, filed on Nov. 5, 2020.

(58) Field of Classification Search
CPC ..... H01L 23/42; H01L 23/427; H01L 23/467; F28D 15/0266; F28D 15/0275; F28D 2021/0029; F28D 2021/0031; F28D 1/0478
See application file for complete search history.

(56) References Cited

U.S. PATENT DOCUMENTS

| | | | |
|---|---|---|---|
| 5,170,930 A | 12/1992 | Dolbear et al. | |
| 6,729,389 B2 | 5/2004 | Ohashi | |
| 7,347,354 B2 | 3/2008 | Hurley et al. | |
| 7,516,777 B2 | 4/2009 | Terakado et al. | |
| 7,836,597 B2 | 11/2010 | Datta et al. | |
| 7,931,072 B1 | 4/2011 | Kroliczek et al. | |
| 8,501,048 B2 * | 8/2013 | Ueno | C22C 47/14 |
| | | | 252/502 |
| 8,627,879 B2 | 1/2014 | Rosenfeld et al. | |
| 9,113,578 B2 | 8/2015 | Cottet et al. | |
| 9,157,687 B2 | 10/2015 | Schon | |
| 9,453,691 B2 | 9/2016 | Lyon | |
| 9,795,058 B2 | 10/2017 | Tsai | |
| 10,443,960 B2 | 10/2019 | Wan et al. | |
| 10,746,479 B2 | 8/2020 | Rush et al. | |
| 2003/0051859 A1 | 3/2003 | Chesser et al. | |
| 2003/0070792 A1 | 4/2003 | Tanaka et al. | |
| 2003/0079863 A1 | 5/2003 | Sugito et al. | |
| 2003/0152764 A1 | 8/2003 | Bunyan et al. | |
| 2003/0207064 A1 | 11/2003 | Bunyan et al. | |
| 2003/0224186 A1 | 12/2003 | Feng et al. | |
| 2003/0234074 A1 | 12/2003 | Bhagwagar | |
| 2004/0017656 A1 | 1/2004 | Lee et al. | |
| 2004/0206477 A1 | 10/2004 | Kenny et al. | |
| 2005/0049357 A1 | 3/2005 | Zhong et al. | |
| 2005/0099775 A1 | 5/2005 | Pokharna et al. | |
| 2005/0172644 A1 | 8/2005 | Zhang et al. | |
| 2005/0228097 A1 | 10/2005 | Zhong | |
| 2005/0241801 A1 * | 11/2005 | Mitchell | H01L 23/467 |
| | | | 165/80.3 |
| 2005/0279491 A1 | 12/2005 | Thome et al. | |
| 2006/0043579 A1 | 3/2006 | He et al. | |
| 2006/0157227 A1 | 7/2006 | Choi et al. | |
| 2008/0201603 A1 | 8/2008 | Ritz et al. | |
| 2008/0216991 A1 | 9/2008 | Oikawa | |
| 2008/0237841 A1 | 10/2008 | Arana et al. | |
| 2008/0264604 A1 | 10/2008 | Campbell et al. | |
| 2009/0016953 A1 | 1/2009 | Weil et al. | |
| 2009/0071625 A1 | 3/2009 | Lyon | |
| 2009/0229794 A1 | 9/2009 | Schon | |
| 2010/0012294 A1 | 1/2010 | Bezama et al. | |
| 2010/0032150 A1 | 2/2010 | Determan et al. | |
| 2010/0319900 A1 | 12/2010 | Abyzov | |
| 2011/0022821 A1 | 1/2011 | Fei et al. | |
| 2012/0018130 A1 | 1/2012 | Chang et al. | |
| 2012/0024499 A1 | 2/2012 | Chang et al. | |
| 2012/0181005 A1 | 7/2012 | Downing | |

| | | |
|---|---|---|
| 2013/0091693 A1 | 4/2013 | Campbell et al. |
| 2013/0193194 A1 | 8/2013 | Yang et al. |
| 2014/0048924 A1 | 2/2014 | Lee |
| 2014/0083652 A1 | 3/2014 | Matsunaga et al. |
| 2014/0102776 A1 | 4/2014 | Lower et al. |
| 2016/0223269 A1 | 8/2016 | Hartmann et al. |
| 2016/0343636 A1 | 11/2016 | Temmei et al. |
| 2018/0231326 A1 | 8/2018 | Rice |
| 2019/0113288 A1 | 4/2019 | Cheng |
| 2019/0116698 A1 | 4/2019 | Lee |
| 2019/0132994 A1 | 5/2019 | Johnson et al. |
| 2019/0393573 A1 | 12/2019 | Hartmann et al. |
| 2020/0103177 A1 | 4/2020 | Chang |
| 2020/0149822 A1 | 5/2020 | Hsu et al. |
| 2020/0373220 A1 | 11/2020 | Chan et al. |
| 2021/0084794 A1 | 3/2021 | Liu |
| 2021/0110980 A1 | 4/2021 | Su et al. |
| 2021/0164736 A1 | 6/2021 | Lyon |
| 2021/0247150 A1 | 8/2021 | Hsu et al. |
| 2022/0082587 A1 | 3/2022 | Gopal et al. |
| 2022/0142001 A1 | 5/2022 | Pokharna et al. |
| 2022/0158273 A1 | 5/2022 | Khateeb Razack |
| 2022/0306887 A1 | 9/2022 | Timler et al. |

FOREIGN PATENT DOCUMENTS

| | | |
|---|---|---|
| KR | 10-2291447 B1 | 8/2021 |
| TW | 200400229 A | 1/2004 |
| TW | 201017837 A | 5/2010 |
| WO | 2015/116661 A1 | 8/2015 |

OTHER PUBLICATIONS

Fasula, Christopher, "Oscillating Heat Pipes (OHP)," A Special Problems Paper Submitted in Partial Fulfillment of the Requirements for the Degree of Masters of Science in Mechanical Engineering and Applied Mechanics, May 2009, 46 pages, University of Rhode Island, United States.
International Preliminary Report on Patentability received for PCT Patent Application No. PCT/US2022/039196, mailed on Jan. 2, 2025, 14 pages.
International Preliminary Report on Patentability received for PCT Patent Application No. PCT/US2023/025894, mailed on Jan. 2, 2025, 8 pages.
International Search Report and Written Opinion for PCT Application No. PCT/US2021/058354, dated Mar. 16, 2022, 15 pages.
International Search Report and Written Opinion for PCT/US2022/039196 mailed Nov. 7, 2022.
International Search Report and Written Opinion received for PCT Patent Application No. PCT/US24/16585, mailed on Jul. 18, 2024, 12 pages.
International Search Report and Written Opinion received for PCT Patent Application No. PCT/US2022/039196, mailed on Nov. 7, 2022, 17 pages.
International Search Report and Written Opinion received for PCT Patent Application No. PCT/US2023/025894, mailed on Oct. 2, 2023, 10 pages.
Office Action for TW 111133089 mailed Aug. 28, 2023.
Office Action received for Taiwan Patent Application No. 111133089 , mailed on Mar. 13, 2024, 10 pages.
Office Action received for Taiwan Patent Application No. 111133089, mailed on Dec. 18, 2024, 2 pages.
PCT International Search Report and Written Opinion for PCT/US 23/25894, mailed Oct. 2, 2023.

* cited by examiner

METALLIC THERMAL INTERFACE MATERIALS AND ASSOCIATED DEVICES, SYSTEMS, AND METHODS

CROSS-REFERENCE TO RELATED DISCLOSURES

This continuation-in-part patent application claims priority to and benefit of U.S. patent application Ser. No. 17/520,597, filed Nov. 5, 2021, which claims priority to and benefit of U.S. Provisional Patent Application No. 63/110,335, filed Nov. 5, 2020. This application also claims priority to and benefit of U.S. Provisional Patent Application No. 63/354,175, filed Jun. 21, 2022, as well as U.S. Provisional Patent Application No. 63/485,925, filed Feb. 19, 2023, and U.S. patent application Ser. No. 17/879,630, filed Aug. 2, 2022. Each of the foregoing patent applications is hereby incorporated by reference in this disclosure, for all purposes, as fully as if reproduced herein as of the effective filing date of each respective, foregoing patent applications.

FIELD

This application and the subject matter disclosed herein (collectively referred to as the "disclosure"), generally concern metallic thermal-interface materials, some of which are loaded with a thermally conductive material, partially or wholly undergo phase transition within an expected range of operating temperatures, or both. More particularly, but not exclusively, this disclosure pertains to devices and systems for transferring heat, e.g., for cooling heat-generating, electrical components, that incorporate such metallic thermal-interface materials.

BACKGROUND INFORMATION

Many industrial processes, consumer goods, power generators, combustion chambers, communication devices, electronic components, electrical storage components (e.g., batteries), etc., and associated systems, rely on heat transfer to function as intended. For example, some rely on cooling (e.g., radio transmitters) and others rely on heating (e.g., endo-thermic chemical reactions) to maintain a temperature within a specified range between an upper threshold temperature and a lower threshold temperature.

The prior art has responded to these challenges with a number of techniques for transferring heat from one medium to another. For example, conventional air cooling uses a fan or other air-mover to draw heat away from or to convey heat to another medium. Air cooling can be supplemented with an air-cooled heat sink, e.g., often a plate of thermally conductive material having surfaces, or fins, extending from the plate to provide a larger surface area available for transferring heat to or from the air flowing over the extended surfaces. Some heat-transfer systems use a liquid to transfer heat, as many liquids provide a relatively higher rate of heat transfer compared to gasses, e.g., air. In still other systems, a heat-transfer fluid changes phase from liquid to gas (or vice-versa) to absorb (or to dissipate, respectively) relatively large amounts of energy over a narrow range of temperatures.

Some prior phase-change systems include a pump to increase an operating pressure of the heat-transfer fluid to urge the heat-transfer fluid through a given circulation loop, as well as to manipulate the thermodynamic state of the heat-transfer fluid to achieve a desired heat-transfer performance from the fluid. On the other hand, some prior heat-pipes and thermosyphons do not incorporate or rely on a mechanical pump to urge the heat-transfer fluid through a thermodynamic cycle. For example, as a heat-transfer fluid in the liquid phase absorbs heat in an evaporator region, the liquid phase transitions to a vapor phase. The vapor phase flows to a condenser region where the vapor phase rejects heat and condenses, returning to the liquid phase (or a saturated mixture of liquid and vapor). A heat-pipe typically includes a porous or other wick material that draws the liquid phase toward the relatively warmer evaporator region from the relatively cooler condenser region. By contrast, a thermosyphon typically relies on gravity to return the condensed liquid phase to the evaporator. A loop thermosyphon typically includes a vapor conduit that carries a vapor phase of the heat-transfer fluid from the evaporator region to the condenser region, and a liquid conduit that carries a liquid phase of the heat-transfer fluid from the condenser region to the evaporator region. Heat pipe systems have been a mainstay of thermal management for a long time. However, this incumbent technology is reaching its limits with devices that have very high power and power density. Some prior approaches for transferring heat use a heat-transfer component (e.g., a "heat exchanger," "heat sink," "cold plate," "evaporator," or "condenser") to transfer heat to a fluid (e.g., a liquid, a gas, or a mixture thereof) from a solid device, or vice-versa. For example, a typical heat-transfer component defines an intended heat-transfer surface to be placed in thermal contact with a corresponding surface of the other solid device. Such placement provides a conductive heat-transfer path between the heat-transfer component and the other solid device. The heat-transfer component facilitates convective heat transfer between the fluid passing through or over the solid features of the heat-transfer component and those solid features. Accordingly, when the heat-transfer component is placed in thermal contact with the solid device, a combination of convective and conductive heat-transfer mechanisms facilitate heat transfer between the solid device and the fluid passing through or over the heat-transfer component.

For example, a cold plate or a heat sink for cooling a heat-generating device (e.g., a processing unit of a computer system) is typically placed into thermal contact with a corresponding surface of the heat-generating device or its packaging. As the heat-generating device operates, excess heat conducts across the interface between the heat-generating device and the cold plate or heat sink. A cooling medium (e.g., air, a mixture of water and glycol, or a two-phase refrigerant) passes through or over features of the cold plate or heat sink, absorbing the excess heat through convective heat-transfer and carrying it away from the cold plate or heat sink to be rejected elsewhere.

A solid-solid interface, even between machined, flat surfaces, can introduce a substantial thermal resistance to the heat-transfer system. As used herein, the term "thermal resistance" means the ratio of temperature difference between two regions to the heat-flux between the two regions. As used herein, "heat-flux" means the rate of heat-transfer per unit area. Thus, "thermal resistance" is the ratio of temperature difference to rate of heat transfer per unit area between two regions, which yields units of $^\circ$C.-cm$^2$/W. Accordingly, an interface with higher thermal resistance results in a relatively larger temperature gradient across the interface for a given heat flux as compared to an interface with lower thermal resistance exposed to the same heat flux. Conversely, a relatively higher thermal resistance results in a relatively lower rate of heat-transfer limit through a given region for a given allowable change in temperature compared to a lower thermal resistance.

Greases, pastes and solders have been used to reduce the so-called thermal-contact resistance (sometimes also referred to in the art as a "contact resistance," "thermal-interface resistance," or "interface resistance") at solid-solid interfaces, improving the capacity to transfer heat across a given interface for a given temperature gradient across the interface. Conventional thermal pastes and greases have required substantial compressive pressure across the solid-solid interface. For example, conventional pressures across the solid-solid interface have needed to exceed 20 pounds-per-square-inch ("PSI") and even up to 50 PSI to achieve conventional thermal-resistance performance. Nevertheless, thermal-contact resistance has remained and still remains a substantial component of the overall thermal budget in many applications facing high power and limited upper-threshold temperature targets.

SUMMARY

Disclosed metallic thermal-interface materials can provide a low thermal-contact resistance across a variety of solid-solid interfaces. For example, some disclosed materials can provide a thermal resistance of less than about 0.05° C.-cm$^2$/W, such as, for example, between about 0.01° C.-cm$^2$/W and about 0.06° C.-cm$^2$/W, with between about 0.02° C.-cm$^2$/W and about 0.04° C.-cm$^2$/W. In some embodiments, disclosed materials provide a thermal-contact resistance of about 0.03° C.-cm$^2$/W. Moreover, these levels of performance can be achieved with less than 20 PSI applied across the solid-solid interface, such as, for example, between about 8 PSI and about 18 PSI, with between about 10 PSI and about 12 PSI. With some embodiments of disclosed thermal-interface materials, a suitable pressure across a solid-solid interface can be about 10 PSI such as, for example, between about 9 PSI and about 12 PSI, or simply greater than about 10 PSI, such as, for example, between about 10 PSI and about 15 PSI.

In some embodiments, a heat-transfer component defines an outer surface configured to mate with a corresponding surface of another device (which can be exothermic or endothermic during its operation). For example, the outer surface of the heat-transfer component can be substantially planar ("flat"), i.e., the outer surface can have a measure of flatness less than about 70 μm/cm, such as, for example, between about 10 μm/cm and about 75 μm/cm, with between about 20 μm/cm and about 50 μm/cm being but one exemplary range of flatness. The corresponding surface of the other device can similarly be flat. In other embodiments, an outer surface of the heat-transfer component can be machined or otherwise formed to have a complementary contour relative to an opposed surface of the other device (e.g., a heat-generating component). For example, if a heat-generating component has a convex (or other, e.g., arbitray, non-flat surface), the outer surface of the heat-transfer component can have a complementary concave (or other negative, non-flat contour) that mates closely with the surface of the heat-generating component.

When mated together, the flat surface of the heat-transfer component can be positioned opposite the corresponding surface of the other device, and a disclosed interface material can be positioned between the opposed surfaces. As described more fully below, this arrangement can provide a thermal-contact resistance between the mated surfaces of less than about 0.05 C.-cm$^2$/W, such as, for example, between about 0.01° C.-cm$^2$/W and about 0.06° C.-cm$^2$/W, with between about 0.02° C.-cm$^2$/W and about 0.04° C.-cm$^2$/W. In some embodiments, the thermal-contact resistance of this arrangement is about 0.03° C.-cm$^2$/W.

Nevertheless, as explained more fully below, disclosed thermal-interface materials can be more forgiving during manufacturing and assembly than prior, conventional thermal-interface materials. For example, disclosed thermal-interface materials can provide lower thermal-resistance across a non-uniform solid-solid interface (e.g., arising from one solid surface being tilted relative to the opposed solid surface, or from a non-uniform surface flatness) than a conventional paste, grease or foil provides, even with a relatively more uniform solid-solid interface.

A loop thermosyphon can combine the best of heat-pipes and traditional liquid-cooling systems that include a mechanical pump. A disclosed heat-transfer device includes a first heat-transfer component and a second heat-transfer component fluidly coupled with each other by a first conduit and a second conduit. A first manifold is positioned in the first heat-transfer component and defines a first plurality of liquid pathways. The first manifold fluidly couples with the first conduit. A second manifold is also positioned in the first heat-transfer component and defines a second plurality of liquid pathways fluidly coupled with and extending from the first plurality of liquid pathways. The second manifold further defines a plurality of boiling channels, a plurality of accumulator channels and a vapor manifold. The boiling channels extend transversely relative to and are fluidly coupled with the second plurality of liquid pathways. The plurality of accumulator channels extends transversely relative to and are fluidly coupled with the plurality of boiling channels. The vapor manifold is configured to collect vapor from one or more of the plurality of boiling channels, one or more of the plurality of accumulator channels, or both. The first heat-transfer component further defines an outlet fluidly coupling the vapor manifold with the second conduit. Electrical devices incorporating such a heat-transfer device also are disclosed, as well as associated methods.

According to a first aspect, a disclosed heat-transfer device includes a first heat-transfer component and a second heat-transfer component fluidly coupled with each other by a first conduit and a second conduit. A first manifold is positioned in the first heat-transfer component and defines a first plurality of liquid pathways. The first manifold fluidly couples with the first conduit. A second manifold is also positioned in the first heat-transfer component and defines a second plurality of liquid pathways fluidly coupled with and extending from the first plurality of liquid pathways. The second manifold further defines a plurality of boiling channels, a plurality of accumulator channels and a vapor manifold. The boiling channels extend transversely relative to and are fluidly coupled with the second plurality of liquid pathways. The plurality of accumulator channels extends transversely relative to and are fluidly coupled with the plurality of boiling channels. The vapor manifold is configured to collect vapor from one or more of the plurality of boiling channels, one or more of the plurality of accumulator channels, or both. The first heat-transfer component further defines an outlet fluidly coupling the vapor manifold with the second conduit.

In an embodiment, the first heat-transfer component defines a fluid chamber and comprises a housing. The fluid chamber is positioned in the housing.

The first manifold can include a plurality of fins positioned in the fluid chamber. The plurality of fins, in turn, can define a proximal edge and a distal edge. The proximal edge of each fin can be thermally coupled with the housing and define a recess corresponding to each in the first plurality of liquid pathways.

Each in the first plurality of liquid pathways can extend transversely relative to the plurality of fins.

Adjacent ones of the plurality of fins can be spaced apart from each other, defining a corresponding plurality of fluid-distribution channels between adjacent fins and extending transversely relative to the first plurality of liquid pathways.

In an embodiment, each in the plurality of fluid-distribution channels between adjacent fins can have an enclosed region adjacent the distal edges of the fins and an open region adjacent the distal edges of the fins. The housing can define an inlet fluidly coupling the first fluid conduit with the open region of the fluid-distribution channels between adjacent fins.

The second manifold can include a plurality of fins positioned in the fluid chamber. The plurality of fins can define a proximal edge and a distal edge, the proximal edge of each fin being thermally coupled with the housing and defining a recess corresponding to each in the second plurality of liquid pathways.

Each in the second plurality of liquid pathways can extend transversely relative to the plurality of fins.

Adjacent ones of the plurality of fins can be spaced apart from each other, defining the plurality of boiling channels between adjacent fins.

Each of the plurality of fins can define a notch corresponding to each respective accumulator channel.

Each in the plurality of boiling channels between adjacent fins can have an enclosed region adjacent the distal edges of the fins and an open region adjacent the distal edges of the fins. Each open region can define an inlet to the vapor manifold.

The housing can define the outlet.

The outlet can extend across more than one of the open regions of the boiling channels.

The first conduit can include a first segment and a second segment. The first segment can extend from a proximal end fluidly coupled with the second heat-transfer component to a distal end having a first fluid coupler. The second segment can extend from a proximal end fluidly coupled with the first heat-transfer component to a distal end having a second fluid coupler. The first fluid coupler and the second fluid coupler can be so complementarily configured relative to each other as to be matingly engageable with each other to provide a fluid connection between the first segment and the second segment.

One or both of the first conduit and the second conduit can include a corresponding first segment configured to fluidly couple with and decouple from a corresponding second segment.

One or both of the first conduit and the second conduit can be configured to fluidly couple with and decouple from the first heat-transfer component, the second heat-transfer component, or both.

The second heat-transfer component can define a fluid chamber and include a housing. The fluid chamber can be positioned in the housing.

The second heat-transfer component can include a first condenser manifold and a second condenser manifold. The first condenser manifold can be positioned in the fluid chamber and define a vapor-distribution channel. The first condenser manifold can be fluidly coupled with the second conduit and further define a plurality of condensing channels and a first plurality of liquid-accumulation channels. The plurality of condensing channels can extend transversely relative to and be fluidly coupled with the vapor-distribution channel. The first plurality of liquid-accumulation channels can extend transversely relative to and be fluidly coupled with the plurality of condensing channels. The second condenser manifold can be positioned in the fluid chamber and define a second plurality of liquid-accumulation channels fluidly coupled with and extending from the first plurality of liquid-accumulation channels. The second condenser manifold can also define a liquid-outlet manifold and a plurality of liquid-conveyance channels configured to convey liquid from one or more of the second plurality of liquid-accumulation channels to the liquid-outlet manifold. The second heat-transfer component can also include an outlet fluidly coupling the liquid-outlet manifold with the first conduit.

A condenser housing can define a condenser chamber. The first condenser manifold can include a plurality of condenser fins positioned in the condenser chamber. The plurality of condenser fins can define a proximal edge and a distal edge, the proximal edge of each condenser fin being thermally coupled with the condenser housing and defining a recess corresponding to each in the first plurality of liquid-accumulation channels.

Each in the first plurality of liquid-accumulation channels can extend transversely relative to the plurality of condenser fins.

Adjacent ones of the plurality of condenser fins can be spaced apart from each other, defining a corresponding plurality of condensing channels between adjacent condenser fins and extending transversely relative to the vapor-distribution channel. Each in the plurality of condensing channels between adjacent condenser fins can have an enclosed region adjacent the distal edges of the condenser fins.

The plurality of condenser fins can be a first plurality of condenser fins and the second manifold can include a second plurality of condenser fins positioned in the condenser chamber. The second plurality of condenser fins can define a proximal edge and a distal edge, the proximal edge of each second condenser fin being thermally coupled with the housing and defining a recess corresponding to each in the second plurality of liquid-accumulation channels.

Each in the second plurality of liquid-accumulation channels can extend transversely relative to the second plurality of condenser fins.

Adjacent ones of the second plurality of condenser fins can be spaced apart from each other, defining the plurality of liquid-conveyance channels between adjacent fins.

The proximal edge of each second condenser fin can further define a recess corresponding to the liquid-outlet manifold.

Each in the plurality of condensing channels between adjacent second condenser fins can have an enclosed region adjacent the corresponding distal edges of the fins.

In another embodiment, the first heat-transfer component includes or is an evaporator and the second heat-transfer component includes or is a condenser.

The first conduit can include or be a liquid conduit and the second conduit can include or be a vapor conduit.

The condenser can include or be a fin-tube heat exchanger having a plurality of fins extending transversely from a plurality of tubes. The fin-tube heat exchanger can be configured to convey a working fluid through the tubes and to direct air over the fins, removing heat from the working fluid passing through the tubes.

A working fluid can be distributed throughout the first heat-transfer component, the second heat-transfer component, the first conduit and the second conduit.

In an embodiment, the working fluid is a saturated mixture of a liquid phase and a vapor phase.

According to another aspect, an electrical device includes an electrical component that dissipates heat while operating and an evaporator thermally coupled with the electrical component. The evaporator defines an inlet and an outlet and has a first manifold and a second manifold. The first manifold defines a first plurality of liquid pathways fluidly coupled with the inlet and the second manifold defines a second plurality of liquid pathways fluidly coupled with and extending from the first plurality of liquid pathways. The second manifold further defines a plurality of boiling channels and a plurality of accumulator channels, as well as a vapor-outlet manifold. The plurality of boiling channels extends transversely relative to and are fluidly coupled with the second plurality of liquid pathways. The plurality of accumulator channels extends transversely relative to and are fluidly coupled with the plurality of boiling channels. The vapor-outlet manifold is fluidly coupled with the outlet and configured to collect vapor from one or more of the plurality of boiling channels, one or more of the plurality of accumulator channels, or both.

The evaporator can define a fluid chamber and include a housing. The fluid chamber can be positioned in the housing.

The first manifold can include a plurality of fins positioned in the fluid chamber. The plurality of fins can define a proximal edge and a distal edge. The proximal edge of each fin can be thermally coupled with the housing and define a recess corresponding to each in the first plurality of liquid pathways.

Each in the first plurality of liquid pathways can extend transversely relative to the plurality of fins.

Adjacent ones of the plurality of fins can be spaced apart from each other, defining a corresponding plurality of fluid-distribution channels between adjacent fins. The plurality of fluid-distribution channels can extend transversely relative to the first liquid pathways.

Each in the plurality of fluid-distribution channels between adjacent fins can have an enclosed region adjacent the distal edges of the fins and an open region adjacent the distal edges of the fins. The housing can define an inlet fluidly coupling the first fluid conduit with the open region of the fluid-distribution channels between adjacent fins.

The second manifold can include a plurality of fins positioned in the fluid chamber. The plurality of fins can define a proximal edge and a distal edge, with the proximal edge of each fin being thermally coupled with the housing and defining a recess corresponding to each in the second plurality of liquid pathways. Each in the second plurality of liquid pathways can extend transversely relative to the plurality of fins.

Adjacent ones of the plurality of fins can be spaced apart from each other, defining the plurality of boiling channels between adjacent fins. Each of the plurality of fins can define a notch corresponding to each respective accumulator channel.

Each in the plurality of boiling channels between adjacent fins can have an enclosed region adjacent the distal edges of the fins and an open region adjacent the distal edges of the fins. Each open region can define an inlet to the vapor-outlet manifold.

The housing can define the outlet. The outlet can extend across more than one of the open regions of the boiling channels.

In an embodiment, the electrical device also includes a first fluid coupler and a first conduit extending from a proximal end fluidly coupled with the inlet to the evaporator to a distal end fluidly coupled with the first fluid coupler. The electrical device can also include a second fluid coupler and a second conduit extending from a proximal end fluidly coupled with the outlet from the evaporator to a distal end fluidly coupled with the second fluid coupler.

The electrical device can include a housing defining an outer boundary of the electrical device. The first fluid coupler, the second fluid coupler, or both, can extend across the outer boundary, providing a corresponding external fluid connection with the evaporator.

The housing can define a sealed enclosure separating the electrical component from an environment external of the housing.

The electrical device can also include a condenser having an inlet and an outlet. The inlet to the condenser can be fluidly coupled with the second fluid coupler and the outlet from the condenser can be fluidly coupled with the first fluid coupler.

The electrical device can also include a condenser having an inlet and an outlet. The inlet to the condenser can be fluidly coupled with the second fluid coupler and the outlet from the condenser can be fluidly coupled with the first fluid coupler.

The first conduit, the second conduit, or both, can have a corresponding first segment and a corresponding second segment. Each respective first segment and second segment can be fluidly couplable with and decouplable from each other. For example, each second segment can be fluidly coupled with the condenser and each first segment can be fluidly coupled with the evaporator.

The electrical device can also include a housing. The electrical component and the evaporator can be positioned within the housing. The condenser can be positioned externally of the housing.

In an embodiment, the condenser has an inlet and an outlet. The electrical device can also include a first conduit fluidly coupling the outlet from the condenser with the inlet to the evaporator, as well as a second conduit fluidly coupling the outlet from the evaporator with the inlet to the condenser.

The condenser can be spaced apart from the housing.

In an embodiment, the electrical device also includes a working fluid distributed throughout the evaporator. For example, the working fluid can include a saturated mixture of a liquid phase and a vapor phase. The foregoing and other features and advantages will become more apparent from the following detailed description, which proceeds with reference to the accompanying drawings.

BRIEF DESCRIPTION OF THE DRAWINGS

Referring to the drawings, wherein like numerals refer to like parts throughout the several views and this specification, aspects of presently disclosed principles are illustrated by way of example, and not by way of limitation.

FIG. 20A and FIG. 204B schematically illustrate an evaporator with a respective embodiment of an augmented thermal contact.

DETAILED DESCRIPTION

The following describes various principles related to metallic thermal-interface materials. More particularly, but not exclusively, some embodiments include devices and systems for transferring heat (e.g., for cooling heat-generating, electrical components) that incorporate such metallic thermal-interface materials. Some disclosed thermal-interface materials partially or wholly undergo phase transition within an expected range of operating temperatures. Nevertheless, components and systems having attributes that are different from those specific examples discussed herein can embody one or more presently disclosed principles, and can be used in applications not described herein in detail. Accordingly, such alternative embodiments also fall within the scope of this disclosure.

I. Overview

Concepts disclosed herein generally concern metallic thermal-interface materials, and in some respects, their application to heat-transfer components and use in heat-transfer systems. For example, some disclosed concepts pertain to systems, methods, and components to facilitate cooling of heat-dissipating components, in part by applying a metallic thermal-interface material to a surface of a heat-transfer component. In other respects, material composition and physical properties of disclosed metallic thermal-interface materials are described. And in still other respects, methods of manufacturing components that incorporate disclosed metallic thermal interface materials are described.

Figure 1:
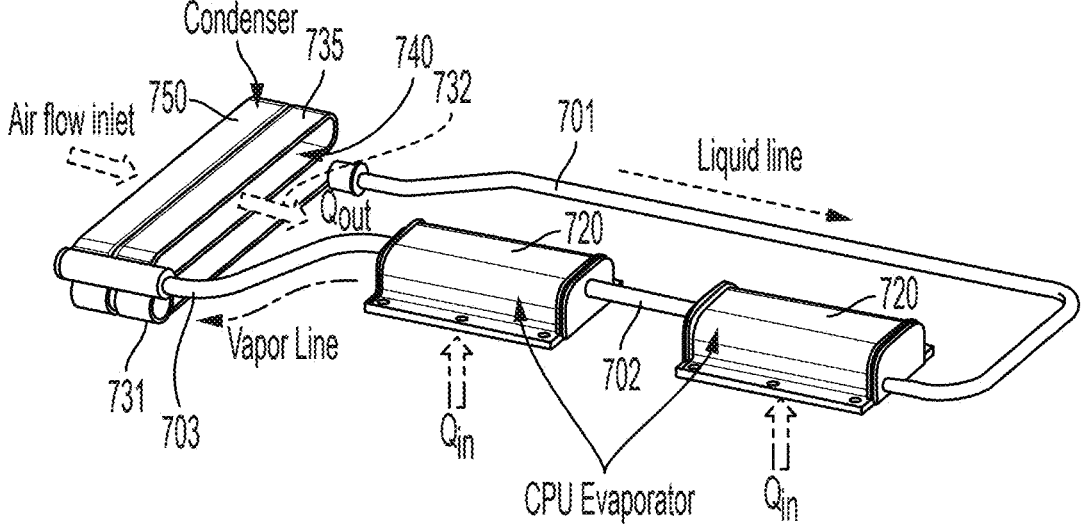
FIG. 1 shows an embodiment of a two-phase heat-transfer system that incorporates a thermal-interface material.

Referring now to FIG. 1, a two-phase cooling system is shown by way of example (although disclosed thermal-interface materials can be used in combination with single-phase cooling systems, e.g., air-cooled or liquid-cooled systems). Referring again to FIG. 1, a loop thermosyphon 700 is shown having a plurality of evaporators fluidly coupled with each other in series (i.e., working fluid that passes through one of the evaporators also passes through the other evaporator(s) serially, one-at-a-time). Each evaporator is thermally coupled with a heat-generating component having an upper-threshold temperature specification. A surface (not shown) of each evaporator is positioned opposite (and placed in thermal contact with) a corresponding surface (not shown) of a processing unit (not shown but generating heat Qin). A metallic thermal-interface material is disposed in the interstitial region between the opposed surfaces of the evaporator and processing unit to facilitate conductive heat-transfer.

A working fluid enters the first evaporator 710, absorbing the heat Qin from the processing unit and exhausting a saturated mixture of vapor and liquid to the first vapor line 702, which then enters the second evaporator 720 and absorbs further heat Qin from another processing unit. The vapor exhausts from the second evaporator 720 to the second vapor line 703 and flows into the condenser 730, where the working fluid rejects latent heat and condenses to the liquid phase, which flows through the liquid conduit back to the first evaporator 710.

Figure 2:
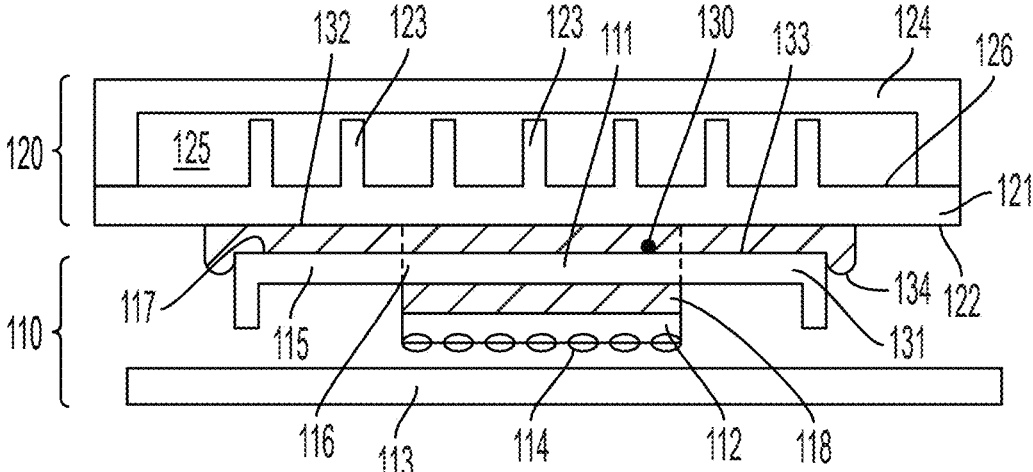
FIG. 2 schematically illustrates a cross-sectional view of a heat-transfer component embodied as an evaporator thermally coupled with a heat-generating device embodied as a processing unit (e.g., a graphics processing unit, a central processing unit). The interface, filled with thermal-interface material, between the heat-transfer component and the heat-generating device is enlarged for illustrative purposes.

FIG. 2 schematically illustrates a cross-sectional view of another heat transfer assembly 100. The assembly 100 includes a heat-generating device 110 cooled by a heat-transfer component 120. Similar to the metallic thermal-interface material described above in relation to FIG. 1, a metallic thermal-interface material 130 is disposed in the interstitial region between the opposed surfaces 122, 111, respectively, of the evaporator and processing unit to facilitate conductive heat-transfer from the heat-generating device 110 to the heat-transfer component 120.

As noted above, a heat-transfer component 120 can assume any of a variety for configurations. Although not so limited, FIG. 2 schematically illustrates the heat-transfer component 120 as an evaporator. As with the evaporators 710, 720 shown in FIG. 1, the heat-transfer component 120 includes a conductive base 121 having fins 123 extending upwardly from an upper surface 126 thereof. The fins 123 define flow channels (e.g., minichannels or microchannels) therebetween. A housing 124 overlies the fins 123 and fluidically seals with the base 121, defining an interior volume 125 through which a working fluid (e.g., a refrigerant that changes phase in this embodiment, but in other embodiments a single-phase liquid) flows as it absorbs heat (e.g., $Q_{in}$, FIG. 1) from the fins, which heat originated from the heat-generating component 110.

Like the heat-transfer component 120, the heat-generating component 110 can assume any of a variety of configurations. Although not so limited, FIG. 2 depicts the heat-generating component 110 as a processing unit having a single functional die 112 mounted in a so-called "flip-chip" arrangement to a functional substrate 113. Solder bumps 114 provide physical and electrical connectivity between circuitry defined by the die 112 and electrical circuitry defined by the substrate 113. (The substrate's 113 further circuitry and solder connections are omitted from FIG. 2 for clarity.) The heat-generating component 110 also includes an integrated heat spreader ("IHS") 115 thermally coupled with the die 112 by way of a primary thermal-interface 118 spanning the interstitial region between the IHS 115 and the die 112. The primary thermal-interface 118 may embody disclosed principles or may be filled with a different material.

Figure 14:
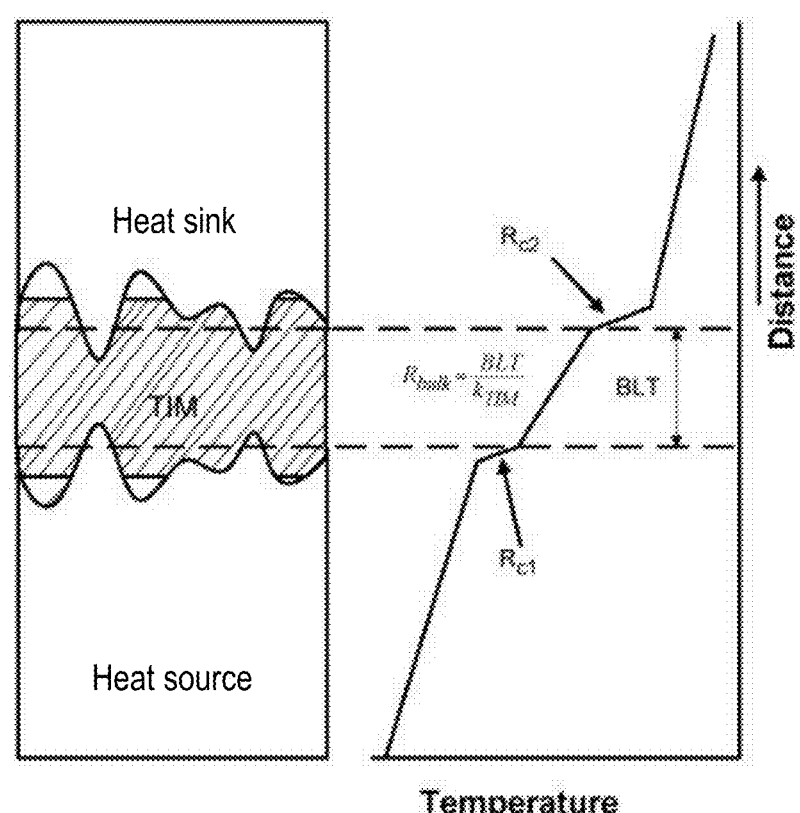
FIG. 14 shows a schematic illustration of a solid-solid interface thermally enhanced with a thermal interface material, together with a plot of temperature vs. position across the solid-solid interface.

Referring still to FIG. 2, the metallic thermal-interface material 130 disposed in the interstitial region between the opposed surfaces 122, 111 defines an IHS-contact region 131 in direct physical contact with the outer surface 111 of the IHS 115. Similarly, the thermal-interface material 130 defines a heat-transfer-component-contact region 132 in direct physical contact with the lower surface 122 of the base 121. Consequently, the thermal-contact resistance at a solid-solid interface between the lower surface 122 of the base 121 and the IHS surface 117, improved with a thermal-interface material 130, can be described as a sum of three discrete, constituent thermal resistances: (1) a thermal-contact resistance between the lower surface 122 and the upper surface of the thermal-interface material 132 ($R_{c2}$ in FIG. 14); (2) a thermal resistance across the thermal-interface material from the surface 132 to the surface 131, corresponding to the bulk thermal conductivity of the thermal interface material 130 ($R_{bulk}$ in FIG. 14); and (3) a thermal-contact resistance between the lower surface 131 of the thermal-interface material and the IHS surface 117 ($R_{c1}$ in FIG. 14).

Figure 15:
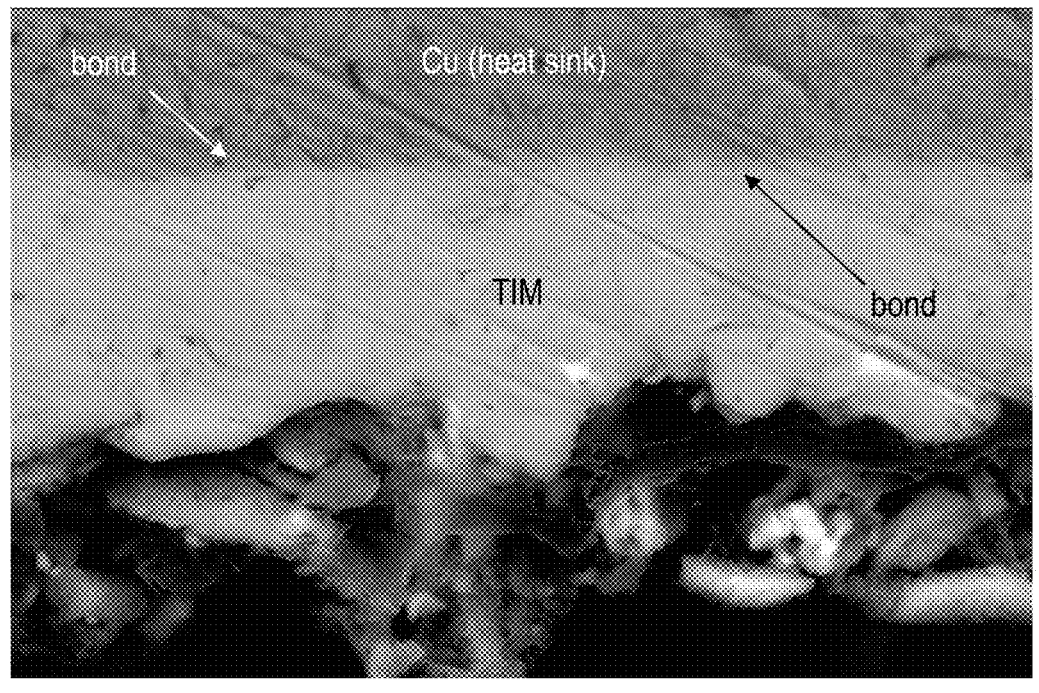
FIG. 15 shows an image taken with a scanning electron microscope showing a disclosed thermal-interface material bonded with copper (e.g., a heat sink or a cold plate).

As described more fully below, some embodiments solder-bond the heat-transfer-component-contact region 132 of the thermal-interface material 130 to the surface 122 of the heat-transfer component 120 before assembling the heat-transfer component into thermal contact with the IHS 115, reducing or eliminating the first level of thermal-contact resistance (i.e., between the lower surface 122 and the upper surface of the thermal-interface material 132 ($R_{c2}$ in FIG. 14)) compared to prior greases, pastes and even metallic foils (including those that change phase during operation). For example, the solder-bond of disclosed embodiments provides significantly better wetting of the lower surface 122 as compared to prior thermal-interface materials, as shown for example in FIG. 15. As also described more fully below, the thermal-interface material 130 can define one or more dams 134 positioned outwardly of the IHS-contact region 131, maintaining a molten form of the thermal-interface material 130 within the confines of interface between the IHS and the heat-transfer component.

During operation of the heat-generating device 110 and the heat-transfer component 120, a temperature of the thermal-interface material 130 can approach or even exceed a melting-point temperature of the material (eutectic mixtures) or one or more constituents (non-eutectic mixtures) of the material. For example, a region 137 (FIG. 3) of the TIM 130, e.g., a volume of material overlying the die 118 and positioned between the dashed lines 116, can melt during normal operation of the heat-generating device 110 and the heat-transfer component 120 while leaving a remaining portion of the TIM 130 (e.g., positioned outward of the dashed lines 116) in a solid phase. The melted, liquidus TIM can effectively wet corresponding regions of the IHS surface 117 and base surface 122, improving thermal contact and reducing thermal resistance between the TIM 130 and each of the components 110, 120. As explained more fully below, some embodiments bond the TIM 130 to the base surface 122, further reducing thermal resistance between the TIM 130 and the component 120. Further, because the metallic TIM 130 can have a bulk thermal conductivity in excess of 50 W/m-K, e.g., between about 50 W/m-K and about 200 W/m-K, such as, for example, between about 60 W/m-K and about 100 W/m-K, or about 70 W/m-K in a specific embodiment, the overall thermal resistance of a disclosed thermal interface using a metallic TIM 130 can be substantially lower than a similar thermal interface using a conventional paste or grease.

As also described more fully below, an embodiment of TIM 130 can be a composite of a metallic binder filled with thermally conductive particles. In some embodiments, the binder material is solder bonded with the thermally conductive particles, further enhancing the bulk thermal conductivity across the thermal interface and correspondingly reducing the thermal resistance between the surfaces 117 and 122.

II. Thermal Interfaces

Figure 3:
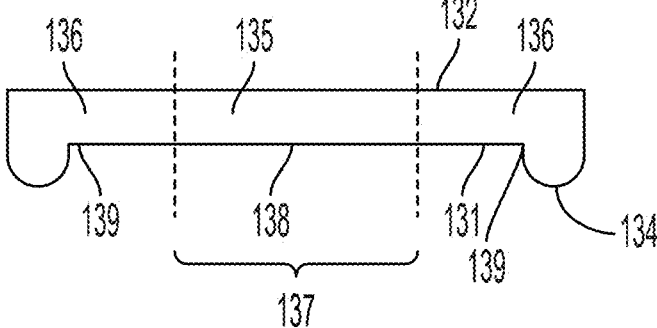
FIG. 3 schematically illustrates an enlarged cross-sectional view of the thermal-interface material in FIG. 2.

Referring now to FIG. 3, an enlarged thermal interface 130 is shown isolated from the corresponding heat-transfer component 120 and heat-generating component 110. The interface 130 has a region 137 corresponding to (e.g., overlying or adjacent to) a given heat source (e.g., the die 112 in FIG. 2). During operation of the heat-generating component 110 and the heat-transfer component 120, some or all of the volume of TIM melts within the region 137. For example, in embodiments where the TIM 130 is a eutectic mixture of constituent components, the TIM 130 can be more likely to melt entirely within the first region 137 during normal operation as compared to a non-eutectic embodiment. In FIG. 3, the volume of TIM that undergoes melting is indicated generally by reference numeral 135 and is substantially coextensive with the region 137 overlying the die 112. In other embodiments, e.g., where the TIM 130 is a non-eutectic mixture of constituent components, one or more constituent components in the TIM 130 can melt while one or more other constituent components remains in a solid phase. In some non-eutectic embodiments, however, the TIM 130 can wholly melt within the first region 137 under selected operating conditions.

A second region 136 of material, positioned outward of the first region 137, partially or entirely encloses the first region and typically remains in a solid phase (sometimes referred to as a "solidus phase"). With some non-eutectic mixtures, one or more constituent components of the TIM in the second region 136 can melt while leaving one or more other constituent components in a solid phase. That is to say, the non-eutectic mixture can begin to melt and, according to a temperature of the TIM, its constituent components, and their relative volume, weight or mass percentages, a portion of the non-eutectic mixture can become a liquidus while a portion remains a solidus. For example, the meltable volume (liquidus) 135 can extend past the boundary 116/region 137.

Figure 4:
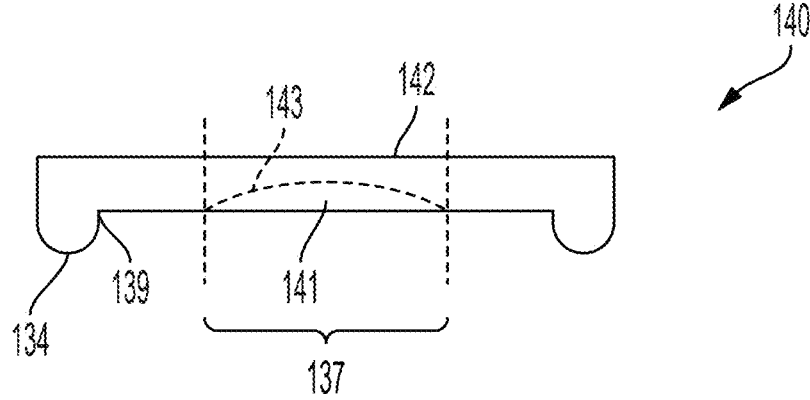
FIG. 4 schematically illustrates an enlarged cross-sectional view of the thermal-interface material in FIGS. 2 and 3 during operation of the heat-generating device.
Figure 5:
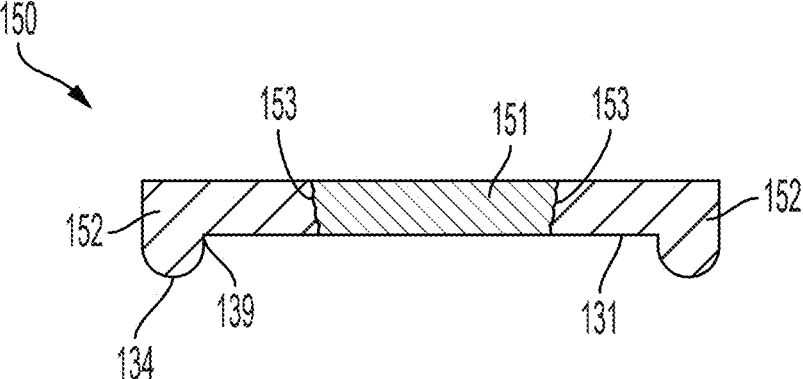
FIG. 5 schematically illustrates another enlarged cross-sectional view of the thermal-interface material in FIGS. 2, 3 and 4 during operation of the heat-generating device.

Such embodiments are illustrated schematically in FIGS. 4 and 5. In FIG. 4, an embodiment of a thermal-interface material 140 is shown. The TIM 140 is substantially the same as the TIM 130 shown in FIG. 3, except in FIG. 4 the TIM 140 is at an elevated operating temperature. In FIG. 4, a portion 141 of the TIM 140 within the region 137 has melted while a corresponding portion 142 of the TIM 130 within the region 137 remains a solidus. A phase-transition boundary 143 between the melted portion 141 and solid portion (or a mixture of a liquidus and solidus) 142 is also shown. Although the portion 141 is shown as being within an outer extent of the region 137 and having a thickness less than a full thickness of the TIM 140, those of ordinary skill in the art will understand and appreciate after considering this disclosure that, depending on the operating temperatures involved and the specific weight-percentages of each constituent component of the TIM 140, the portion 141 can be entirely melted or can be a combination of liquidus and solidus components. Similarly, those of ordinary skill in the art after considering this disclosure will understand that the portion 141 can extend through a full thickness of the TIM 140.

For example, FIG. 5 shows a heated TIM 150 that is similar to the TIM 130, 140 under a different operating condition (e.g., at a higher temperature or embodied as a TIM having a lower liquidus temperature). In FIG. 5, the melted region 151 extends through a full thickness of the TIM 150 and yet lies within an outer boundary of the IHS (indicated by corners 139). Laterally outward of the melted region 151, the TIM 150 has a solidus (or a mixture of liquidus and solidus) region 152 "encapsulating" the melted region 151. An interface boundary 153 extends between the solidus region 152 and the melted region 151.

By remaining a solidus during operation of the heat-generating component 110 and the heat-transfer component 120, the regions 142, 152 can inhibit leakage or seepage of the liquidus TIM 141, 151 from the interstitial gap between the surfaces 111, 122. Moreover, providing a solid (or a solidus-liquidus mixture) barrier encapsulating the melted volume 141, 151 can inhibit diffusion of oxygen to and throughout the melted TIM, inhibiting oxidation of the TIM and maintaining its thermal and other material characteristics.

In each of FIGS. 3, 4 and 5, at a position laterally outward of the IHS boundary (indicated by corners 139), the thermal-interface material 130, 140, 150 defines a thickened region 134 defining a dam that further inhibits leakage or seepage of liquidus (or a mixture of liquidus/solidus) TIM from the interstitial gap between the surfaces 111, 122 of the IHS and heat-transfer component. The thickened region 134 extends laterally outward from a periphery of the IHS 115 (indicated by the corner 139) to an outer periphery of the TIM 130.

In a multi-chip package, not shown, the region of solidus TIM can define a "lattice" extending around each region of liquidus (or mixture of liquidus/solidus) TIM. For example, each melted or meltable (e.g., softened mixture of liquidus and solidus) region can correspond to a given die in the multi-chip package. In such embodiments, the volume 135 of TIM that melts can again be coextensive with each region 137. In other embodiments, e.g., single-chip packages where the die defines one or more "hot-spots" or multi-chip packages where one or more of the plurality of dice defines one or more "hot-spots," each volume 135 that melts can correspond to a given "hot-spot" location and shape, e.g., can be smaller than the region 137 of TIM that overlies a given die. In such embodiments, the second region 136 of the TIM that remains solidus (or a liquidus and solidus mixture) can extend around each meltable region 135 over-top a portion of each respective die. In still other embodiments, the meltable region 135 extends outward of a portion or all of the die 112, with the second region 136 wholly or partially enclosing the meltable region 135. In each of these alternative embodiments, the solidus portion of the TIM can inhibit seepage or leakage of the melted TIM while also inhibiting diffusion of oxygen into and through the melted (liquidus) TIM, inhibiting oxidation of the melted TIM and a corresponding degradation in thermal performance. Where the second region (or a portion thereof) has a mixture of liquidus and solidus, the viscosity of the solidus-liquidus mixture can exceed that of the liquidus in the region 135 and thus can inhibit seepage or leakage of the melted TIM while also inhibiting diffusion of oxygen into and through the melted (liquidus) TIM, inhibiting oxidation of the melted TIM and a corresponding degradation in thermal performance.

III. Heat-Transfer Components with Pre-Applied Tim

In some respects, disclosed principles pertain to heat-transfer components having layer of TIM applied to a heat-transfer surface before assembly of the heat-transfer component with a heat-generating (or a heat-absorbing) device.

Figure 6:
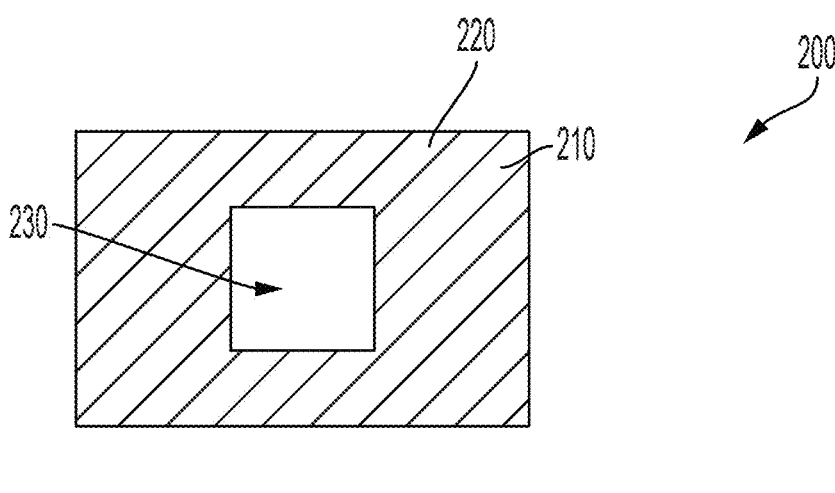
FIG. 6 schematically illustrates an intermediate construct arising from a process for applying a metallic thermal-interface material to a surface of a heat-transfer component.
Figure 7:
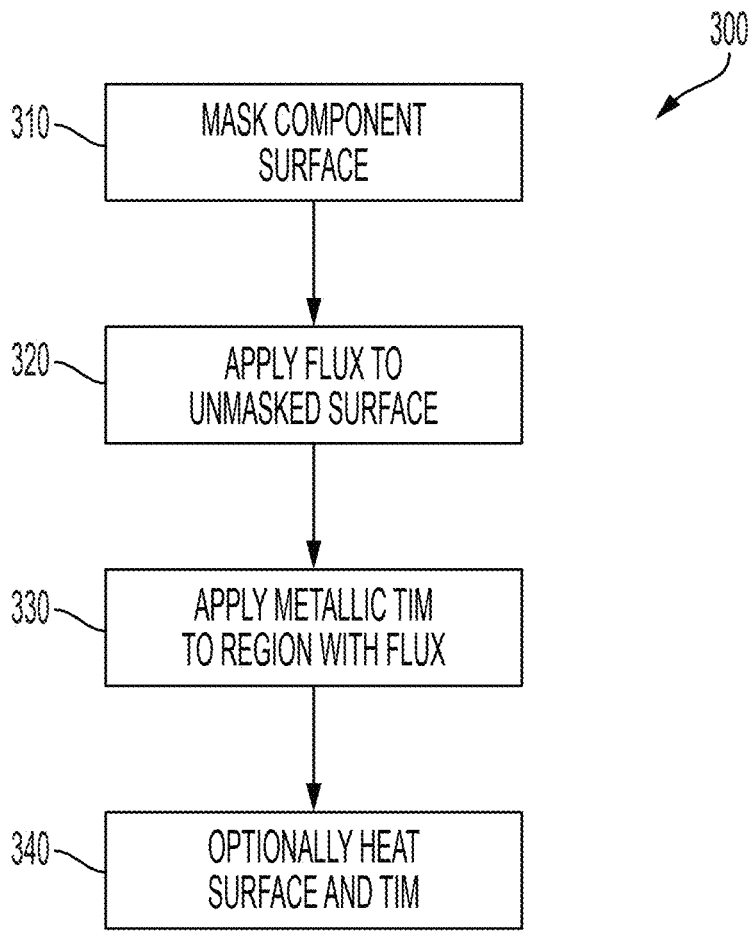
FIG. 7 schematically illustrates a process for applying a metallic thermal-interface material to a surface of a heat-transfer component.

Referring now to FIGS. 6 and 7, a process 300 for applying a thermal-interface material (e.g., any of TIM 130, 140, 150) to a heat-transfer component is described. More particularly, the process 300 solder-bonds the thermal-interface material to the heat-transfer component, providing an enhanced thermal coupling, as well as an enhanced physical coupling, between the heat-transfer component and the TIM compared to prior art heat-transfer components with pre-applied thermal-interface materials (e.g., greases and pastes).

At 310, the process 300 includes the act of masking a component surface. Taking the heat-transfer component 120 (FIG. 2) as an example, a region of the surface 122 can be covered with a mask 220 (420 in FIG. 12) while leaving a region intended to be exposed to a metallic thermal-interface material exposed. Referring again to FIG. 6, a mask 220 is shown applied to a thermal-contact surface of a heat-transfer component, leaving an interior region 230 exposed. The interior region 230 can define an outer periphery (shown as the solid line between the unmarked region 230 and the cross-hatching of the masked region 220) that is larger than an outer periphery of a corresponding IHS surface (e.g., larger than an outer periphery of the IHS 115 in FIG. 2). In FIG. 6, the mask 220 extends to the outer periphery 210 of the heat-transfer component 200.

At 320 in FIG. 7, flux is applied to the unmasked region 230 (FIG. 6). Before applying flux, the unmasked region can be (but need not be) treated to remove an oxidation layer that may have formed on the surface of the heat-transfer component. For example, the region can be sanded with a high-grit sandpaper or otherwise abraded to remove oxidation. Alternatively (or additionally), an oxidation layer can be removed with a chemical etching compound or other known approach for removing oxidation. The mask 220 can prevent such treatments from expanding past the outer periphery of the region 230, as well as prevent or inhibit application of flux beyond the outer periphery of the region 230. Further, some embodiments of heat-transfer components 120 have a base 121 formed of copper. Although some disclosed thermal-interface materials can be soldered to copper, some copper bases 121 are coated with nickel (e.g., electroplated with nickel) or coated with another metal that is more amenable to soldering with a disclosed thermal-interface material than copper. As will be understood by a person having ordinary skill in the art, the act of coating the base 121 with nickel or other material typically can (but need not) occur prior to the act of masking, the act of applying flux to the unmasked region, or both.

At 330, the metallic TIM (400 in FIGS. 13 and 600 in FIG. 10) is applied to the region 230 that has had flux applied. For example, a foil of the metallic TIM can be positioned to overlie the region 230. Alternatively, a molten phase of the metallic TIM can be poured into the region 230. Under either approach, the heat-transfer component can be maintained at an ambient temperature or can be heated (as at 340) to a temperature at or above a melting temperature of the TIM. Pouring a molten phase of the metallic TIM or heating the heat-transfer component beyond the melting temperature of the TIM can form a solder bond between the surface of the heat-transfer component and the TIM. For example, the liquid-phase of the TIM can flow into microcsopic interstices on the surface of the heat-transfer component and, in some embodiments, penetrate slightly into the surface of the heat-transfer component. Such wetting and penetration by the TIM can be enhanced by removal of any oxide layer and application of flux as at 320. In some embodiments, the act 320 of applying flux to the unmasked surface, the act 330 of applying the metallic TIM to the fluxed region, or both acts, can include providing an inert atmosphere (e.g., a nitrogen atmosphere) around the surfaces being treated and the TIM being applied to inhibit or eliminate oxidation of the base, oxidation of the TIM, or both, as such oxidation can reduce thermal performance.

Figure 10:
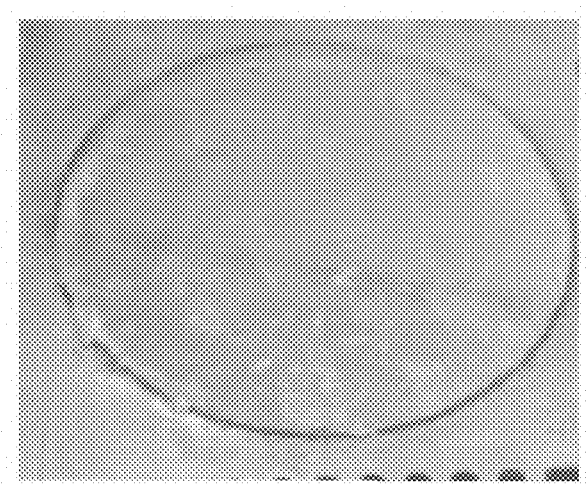
FIG. 10 is a photograph of a surface region of another working embodiment of a heat-transfer component having a metallic thermal-interface material bonded thereto.
Figure 12:
FIG. 12 is a photograph of a working embodiment of an intermediate construct as depicted in FIG. 6.
Figure 13:
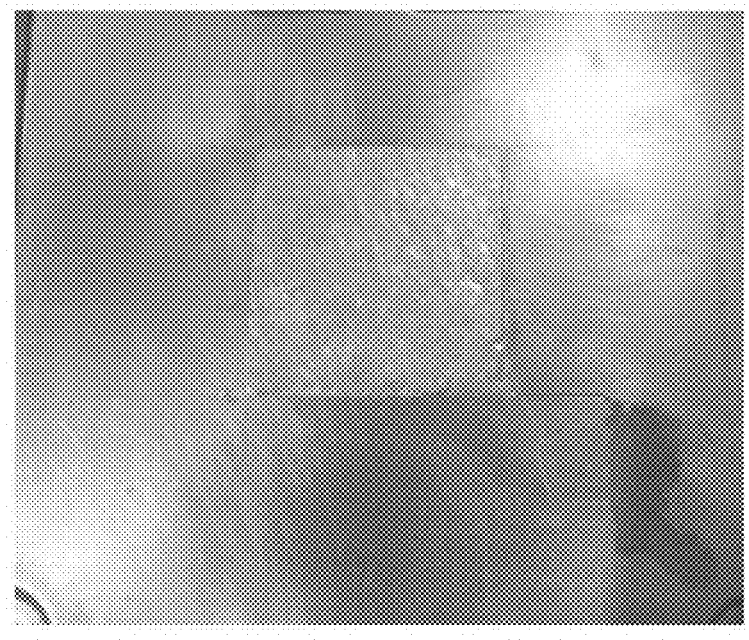
FIG. 13 is a photograph of a working embodiment of a heat-transfer component having soldered thereto a metallic thermal-interface material as described herein.

On cooling, a portion of the TIM forms an intermetallic bond with the heat-transfer component (see FIG. 15), enhancing the durability of the layer of TIM as well as the thermal coupling of the TIM with the heat-transfer component compared to prior heat-transfer components having a pre-applied layer of grease or paste. FIG. 12 is a photograph of a working embodiment of an intermediate construct analogous to the construct 200 shown in FIG. 6. In FIG. 12, the mask remains. FIG. 13 shows the same working embodiment as in FIG. 12, albeit with the mask removed. FIG. 10 shows another working embodiment of a metallic thermal-interface material 600 solder-bonded to a heat-transfer component (e.g., an air-cooled heat sink).

A heat-transfer component with a solder-bonded layer of metallic thermal-interface material can be assembled with a heat-generating (or heat-absorbing) device in an arrangement as in FIG. 2. In some embodiments, an exposed surface (431 in FIGS. 6 and 631 in FIG. 11) of the TIM can be prepared to mate closely to a contour of an intended surface of a heat-generating component, e.g., prior to physically assembling the heat-transfer component with the heat-generating component. For example, after or in conjunction with the act 330 of applying a metallic TIM to the fluxed region of the heat-transfer component, a flat (or other suitably contoured) tool having a contour mimicking a contour of an intended IHS surface 111 can be urged against the TIM (e.g., the molten TIM). If applied to a molten TIM, the tool can remain in contact with the TIM until the TIM solidifies. Such contouring of the TIM can enhance mating of the TIM with the IHS while also reducing or eliminating excess TIM that otherwise could escape the bond-line between the surface 122 of the heat-transfer component and the upper surface 111 of the IHS. In some embodiments, the tool can be a sheet of glass or ceramic having at least one major surface having the desired contour (e.g., flat or mimicking a contour of the intended IHS).

After this physically assembling the heat-transfer component with the heat-generating component, and before normal system operation, the interstitial layer of thermal-interface material and the bounding, opposed surfaces of the heat-generating (or heat-absorbing) device and heat-transfer component can be heated beyond a melting temperature of the thermal-interface material. For example, the assembly can be heated in an oven or a heat-generating device can be operated under a load sufficient to heat the TIM beyond its melting temperature.

Figure 8:
FIG. 8 is a photograph of a surface region of a working embodiment of a heat-transfer component having a metallic thermal-interface material bonded thereto.
Figure 9:
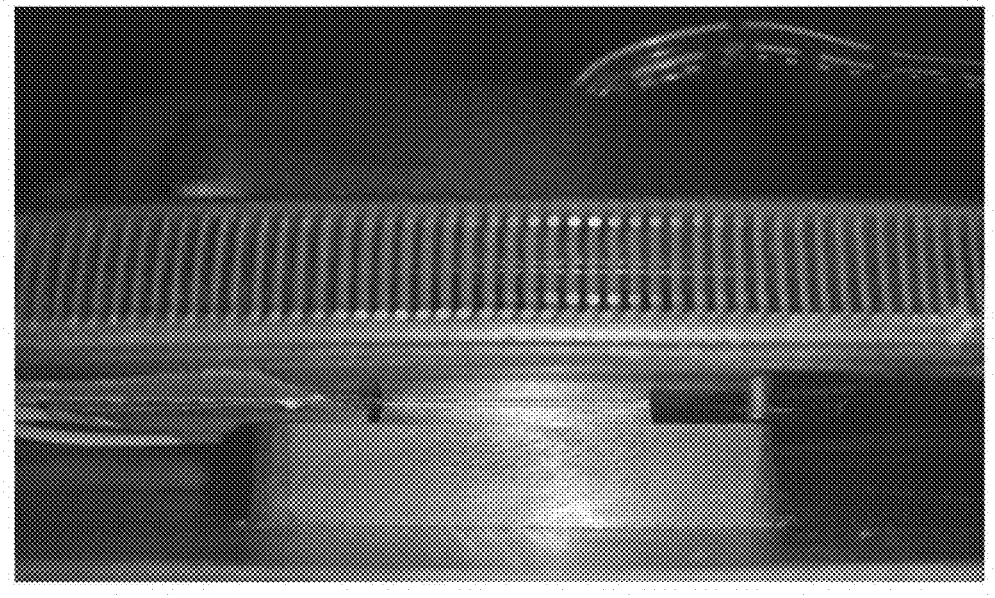
FIG. 9 is a photograph showing a side-elevation of a heat-transfer component mounted to a heat-generating device and an interface therebetween filled with a metallic thermal-interface material as described herein.
Figure 11:
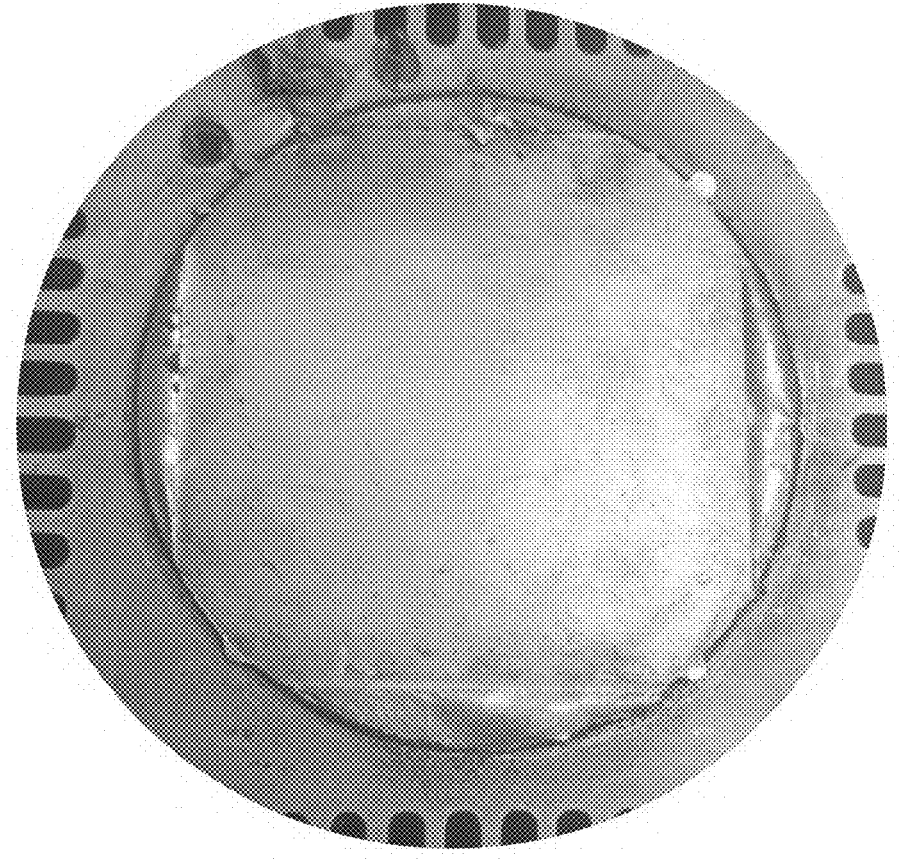
FIG. 11 is a photograph of a surface region of yet another working embodiment of a heat-transfer component having a metallic thermal-interface material bonded thereto.

This further cycle of heating can enhance thermal contact between the TIM and the heat-generating (or heat-absorbing) device, thus improving overall thermal contact between the heat-transfer component and the heat-generating (or heat-absorbing) device. For example, this further cycle of heating can allow excess TIM to fill any interstitial air gaps. Such further cycle of heating also can reduce a thickness of the interstitial space between the opposed surfaces of the heat-generating (or heat-absorbing) device and the heat-transfer component, as by allowing excess TIM to flow outwardly past a heat-transfer surface 431 of the heat-generating (or heat-absorbing) device, forming a ridge (or dam, analogous to the dam 134 shown in FIG. 2, dam 434 shown in FIG. 8, dam 634 shown in FIG. 11). FIGS. 8 and 11 show the working embodiments 400, 600 in FIGS. 13 and 10, respectively, after undergoing a further cycle of heating and being disassembled from the test rig 500 shown in FIG. 9 (heat sink 520 and heat source 510).

IV. Metallic Thermal Interface Material
Compositions and Properties

Disclosed metallic thermal-interface materials can incorporate eutectic and non-eutectic mixtures of Bismuth, Indium, Tin and Gallium. As understood by those of ordinary skill in the art, eutectic mixtures exhibit a melting-point temperature (or a narrow-band of temperatures over which melting occurs) that is below the melting point of each constituent component in the mixture, while non-eutectic mixtures melt over a broader range of temperatures. Adjusting the relative weight percent of each constituent component in a mixture of Bismuth, Indium, Tin and Gallium can correspondingly adjust the melting temperature (or range of temperatures for non-eutectic mixtures) of the mixture.

Some metallic TIM embodiments suitable for forming a solder-bond with a heat-transfer component as described herein have a eutectic melting point temperature of about 60° C. (e.g., between about 57° C. and about 63° C., such as, for example, between about 58° C. and about 61° C.), a eutectic melting point temperature of about 70° C. (e.g., between about 67° C. and about 73° C., such as, for example, between about 68° C. and about 71° C.), a eutectic melting point temperature of about 80° C. (e.g., between about 77° C. and about 83° C., such as, for example, between about 78° C. and about 81° C.), and a eutectic melting point temperature of about 90° C. (e.g., between about 87° C. and about 93° C., such as, for example, between about 88° C. and about 91° C.).

Some metallic TIM embodiments suitable for forming a solder-bond with a heat-transfer component as described herein are non-eutectic. Such non-eutectic TIMs exhibit a hysteresis-like range of phase-change temperatures. For example, some disclosed, non-eutectic metallic TIMs have a melting point temperature (e.g., where a negligible portion of solidus remains) of about 90° C. and a freezing point temperature (e.g., where a negligible portion of liquidus remains) of about 70° C. As noted above, some components of such a non-eutectic TIM begin to melt below about 90° C. (e.g., between about 75° C. and about 85° C., such as, for example about 85° C.). Similarly, some components of such a non-eutectic TIM begin to solidify above about 70° C. (e.g., between about 75° C. and about 85° C., such as, for example about 85° C.).

In some disclosed alloys, a viscosity of a molten phase is very low and reduces a bond-line thickness between the base 122 and the upper surface 111 of the IHS by such a large degree that a thermal resistance between the base 122 and the upper surface 111 deteriorates compared to other disclosed alloys. Nevertheless, such alloys can be combined with one or more other materials that remain in a solid phase during operation of the heat-generating component, e.g., a powdered or other small-particle form of the other material, to increase a viscosity or to provide a lower-threshold bond-line thickness between the base 122 and the upper surface 111. Examples of such other materials include particle forms of ceramics, e.g., aluminum oxide, aluminum nitride, silicon carbide, diamond, zinc oxide, boron nitride, etc. Other examples of such other materials include particle forms of other metal alloys, e.g., alloys of copper or silver.

V. Metallic Thermal Interface Materials with Fillers

In further embodiments, a metallic thermal-interface material can comprise a composite mixture. For example, a metallic carrier or binder material, e.g., an embodiment of a metallic thermal-interface material described above, can be combined with a particulate filler material. For example, individual particles of the filler material can be suspended within the carrier. Further, embodiments in which the particulate filler material has a higher bulk thermal conductivity than the bulk thermal conductivity of the carrier material can yield a composite mixture having a bulk thermal conductivity greater than a bulk thermal conductivity of the carrier material alone. In some embodiments, the particulate filler material is a metal alloy such as, for example, a powdered alloy of copper. Exemplary but non-limited powered copper alloys have particles ranging in size from about 0.5 μm to about 2 μm, such as, for example, between about 0.4 μm to about 2.2 μm, or from about 0.6 μm to about 1.9 μm, with particles sized from about 0.7 μm to about 1.6 μm being a particular example.

That being said, thermal-contact resistance between the carrier material and individual particles of the filler material can limit an overall improvement in bulk thermal conductivity of the composite mixture provided by the more conductive filler particles compared to the bulk thermal conductivity of the carrier material alone. For example, in some embodiments, the carrier material may partially, but not fully, wet each particle, leading to a thermal-contact resistance between the carrier material and the partially wetted particles. The thermal-contact resistance arising from partially wetted particles can diminish heat transfer from the metallic carrier material to the more conductive filler particle. Indeed, the addition of a more conductive particulate filler material to a metallic carrier can actually degrade the bulk thermal conductivity because the additional thermal-contact resistance can outweigh the benefit of the higher conductivity of the particulate fill material.

Nevertheless, some disclosed embodiments reduce or eliminate thermal contact resistance between the filler particles and the carrier material by improving wetting of the filler particles by the carrier material. For example, some embodiments of composite thermal interface materials bond the carrier material with the filler particles to improve wetting of the particles. In some embodiments, the metallic carrier has less than about 10% (weight) Gallium to further improve wetting of the copper particles.

By way of further example, diffusion soldering the carrier material (e.g., a metallic thermal-interface material as described above) with thermally conductive filler particles can improve the thermal interface therebetween, significantly reducing thermal-contact resistance between the carrier and the filler particles. The bonding process can be a low temperature process (e.g., less than about 100° C., such as for example, between about 70° C. and about 105° C., e.g., between about 85° C. and about 100° C., with between about 90° C. and about 95° C. being a range in one or more particular embodiments).

Powdered alloys of copper can be treated to remove oxides that tend to form on exposed copper surfaces, as such oxides tend to decrease bulk thermal conductivity of the powdered copper and further tend to interfere with wetting and solder bonding. For example, a powered copper alloy can be washed with acetic acid to remove copper oxides without attacking the underlying copper particles before being treated with a flux that promotes bonding between the carrier material and the copper particles.

Such embodiments of composite materials having diffusion bonds between the carrier material and filler particles can achieve a bulk thermal conductivity approximated by a volume-weighted or mass-weighted sum of the thermal conductivity of the carrier material with the thermal conductivity of the filler material. In one exemplary embodiment, a 30% volumetric fraction of copper powder can be diffusion bonded with a carrier of a metallic thermal-interface material described above, providing a bulk thermal conductivity greater than about 70 W/mK, which represents a surprising increase in bulk thermal conductivity compared to prior thermal interface materials.

And, bonding the carrier material with particles of thermally conductive materials can increase the viscosity of the resulting composite material compared to the viscosity of the carrier material alone. By contrast, prior approaches for loading liquid metals with metallic or ceramic particles, which relied simply on mixing the particles into a liquid metal and resulted in poorly wetted particles, led to weak adhesion between the particles and the liquid metal. Such mixtures have a consistency similar to a fine sand in water. By bonding the particles with the carrier, the mixture behaves more cohesively, similar to a thermal grease where, due to excellent wetting characteristics of silicone oils, particles in disclosed embodiments do not readily separate from the carrier.

Disclosed fillers can be made from any thermally conductive, particulate material capable of being diffusion bonded with a disclosed metallic thermal-interface material. Such conductive fillers can include powdered alloys of copper, such as, for example, alloy powders having particles ranging in size from about 5 micron to about 50 micron, such as, for example, from about 4 micron to about 60 micron. Some powered copper alloys can have a narrower range of particle sizes, for example, between about 5 micron and about 10 micron, or between about 10 micron and about 25 micron, or between about 25 micron and about 50 micron.

Further, since (1) viscosity can be relatively high compared to unloaded liquid metals and metallic thermal interface materials, and (2) conductivity can be very high, disclosed composite materials can be applied in a relatively thick bond line at a thermal interface, e.g., between about 50 μm and about 200 μm, without significantly degrading performance (e.g., without significantly increasing the thermal resistance across the bondline). Such advantages lend disclosed composite materials to be particularly suited for use with modern processors, many of which are chiplet-based, e.g., with one large chip and one or more small chips proximal to the large chip to provide communication or other functions. Moreover, large chips have inherently more die flexure and curvature which requires thicker TIM applications to accommodate the resulting gap between the die surface and the cooling device that receives waste heat from the chips. Conventional thermal interface materials are ill-suited for such applications, either because they require very thin bond-line thickness due to low viscosity and/or relatively low thermal conductivity compared to disclosed composite materials. As with some embodiments of metallic TIMs discussed above, a composite TIM as just described can undergo a measure of phase transition during operation of a component to be cooled, further reducing a thermal resistance across the interface between the component (e.g., device 110 in FIG. 2) and a cooling device (e.g., component 120 in FIG. 2).

Figure 16:
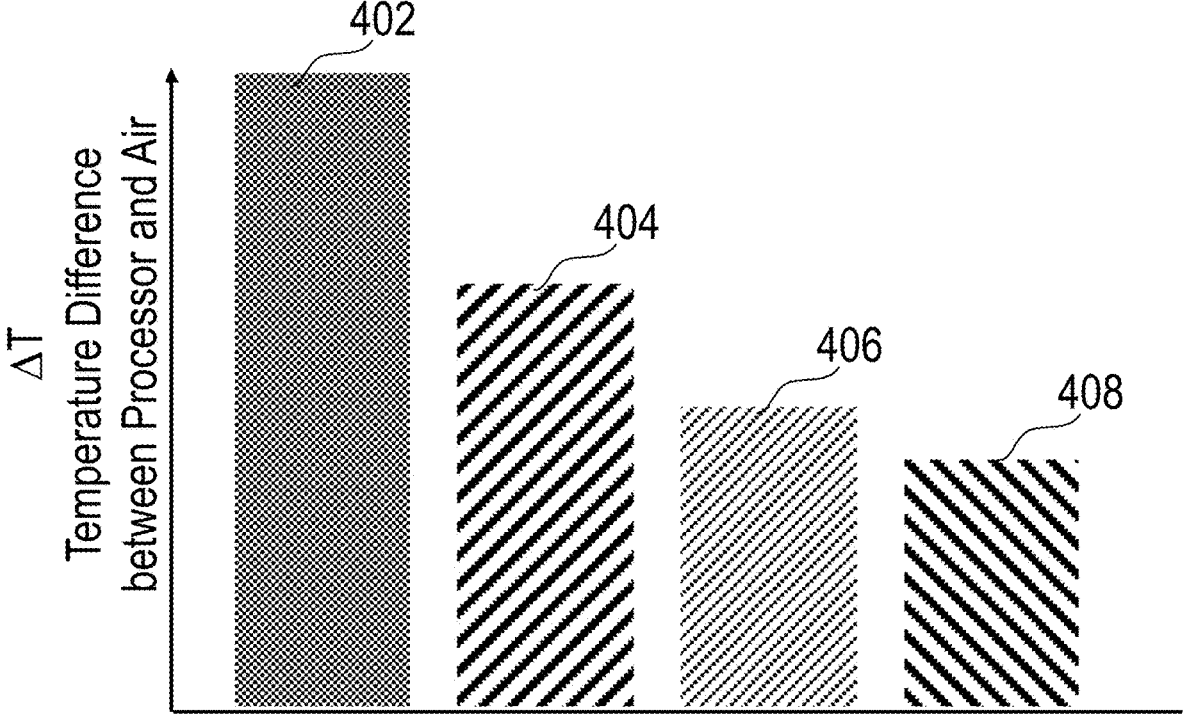
FIG. 16 shows a comparison of processor temperature rise above a local air temperature for different types of thermal interface materials.

Further, disclosed embodiments of thermal-interface materials can be applied to existing data center technologies, allowing CPU temperatures to operate several degrees centigrade below temperatures achieved using conventional thermal interface materials. Alternatively, use of disclosed embodiments of thermal-interface materials can allow for an increase in the background temperature or decreased consumption of, e.g., fan power. FIG. 16 shows a typical reduction in temperature difference between a processor and air temperature for different thermal interface materials, e.g., a conventional grease 402, a conventional liquid metal 404, a bonded-but-unfilled liquid metal 406 as disclosed herein, and a composite material 408 as described herein filled with 11% (weight) copper powder.

VI. Loop Thermosyphon Embodiments

This section generally concerns devices and systems for facilitating heat transfer, and related methods. More particularly, but not exclusively, this section pertains to loop thermosyphon devices and systems, and related methods, for cooling one or more heat-dissipating components, such as, for example, an electrical device.

A loop thermosyphon can combine the best of heat-pipes and traditional liquid-cooling systems that include a mechanical pump. Like a heat pipe, a thermosyphon is passive, and like a pumped liquid loop, a loop thermosyphon can transport heat over a long distance due to an ultra-low thermal resistance provided by two-phase heat transfer. And, using a selected working fluid, even the small available height within a 1U server (e.g., about 1.75 inches) can provide sufficient flow within a disclosed loop thermosyphon to move 500 W of heat. An embodiment of a disclosed evaporator can achieve a low thermal resistance of 0.01° C.-cm$^2$/W with up to about 90 W/cm$^2$ of heat flux. A disclosed embodiment of a loop thermosyphon can passively cool about 1 kW of heat from an IP rated (e.g., a sealed) enclosure.

Various principles related to loop thermosyphons are disclosed. For example, certain aspects of disclosed principles pertain to evaporator features and certain other aspects pertain to features of conduits coupling an evaporator with a condenser. And still other aspects pertain to systems that such loop thermosyphons. That said, descriptions herein of specific apparatus configurations and combinations of method acts are but particular examples of contemplated features chosen as being convenient illustrative examples of disclosed principles. One or more of the disclosed principles can be incorporated in various other components and systems to achieve any of a variety of corresponding functional characteristics.

Thus, components and systems having attributes that are different from those specific examples discussed herein can embody one or more presently disclosed principles, and can be used in applications not described herein in detail. Accordingly, such alternative embodiments also fall within the scope of this disclosure.

VI.A. Overview

Some concepts disclosed herein generally concern loop thermosyphon devices and systems, and associated methods. Some disclosed concepts pertain to systems, methods, and components to facilitate cooling of heat-dissipating components with such a loop thermosyphon. In some respects, a disclosed embodiment of loop thermosyphon is a closed, hermetically sealed system, as in FIG. 17, partially filled with a working fluid having little or no non-condensable gas. As but one example, a disclosed loop thermosyphon system can be configured to passively cool up to 1 kW dissipated by one or more electrical components within a sealed enclosure using a passively driven, self-sustained fluid motion.

Figure 17:
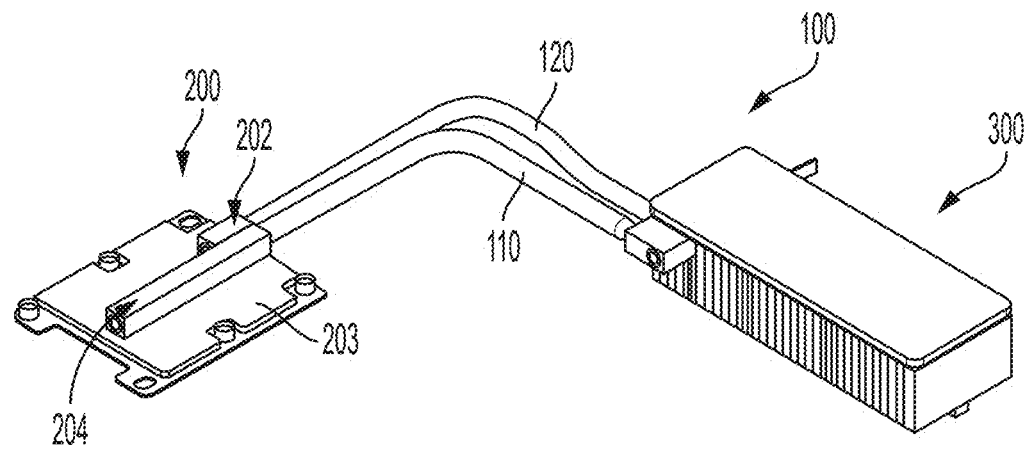
FIG. 17 illustrates an isometric view of a loop thermosyphon.
Figure 18:
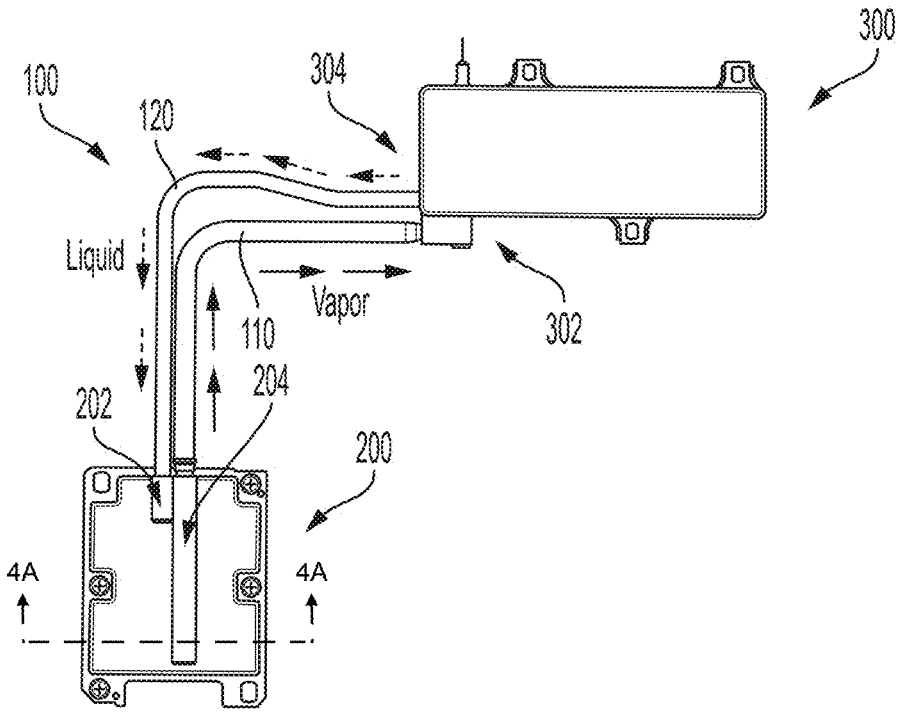
FIG. 18 illustrates a side elevation view of the loop thermosyphon shown in FIG. 1.

FIGS. 17 and 18, by way of example, illustrate aspects of such a loop thermosyphon. The illustrated loop thermosyphon 100 includes an evaporator 200 and a condenser 300 coupled with each other by a vapor (evaporator-to-condenser) conduit 110 and a liquid (condenser-to-evaporator) conduit 120. The evaporator 200 can be thermally coupled with one or more electrical components, for example, that dissipate heat during operation. The evaporator can transfer heat absorbed from the electrical components to a working fluid passing through the evaporator. The self-sustained fluid motion can carry the working fluid through the conduit 110 to the condenser 300, where the absorbed heat is rejected to another medium (e.g., atmosphere or a facility-supplied liquid). The working fluid, cooled by the condenser, can return to the evaporator 200 through the second conduit 120.

The self-sustained fluid motion of a loop thermosyphon results from a density gradient within the working fluid that arises from simultaneous evaporation in an evaporator region and condensation in a condenser region. Disclosed loop thermosyphons provide a vapor-phase flow path separate from a liquid-phase flow path, accentuating the self-sustained fluid motion. Heat is supplied at a lower elevation of the thermosyphon device (in the evaporator), where the working fluid, sometimes also referred to in the art as a "refrigerant," changes phase from a liquid phase to a vapor phase, or a saturated mixture of the liquid phase and the vapor phase. The liquid-vapor mixture, being less dense than the liquid phase, rises through a two-phase adiabatic section (e.g., conduit 110) until the mixture reaches the condenser (positioned at a relatively higher elevation, relative to gravity, than the evaporator). At the condenser, the latent heat contained in the liquid-vapor mixture is released, condensing the refrigerant to the liquid phase. The condensed liquid phase returns through a second adiabatic section to the evaporator, where evaporation again occurs, driving the passive, gravity-driven flow-motion.

Each respective conduit 110, 120 is substantially adiabatic, e.g., provides little if any transfer of heat to or from the working fluid passing through the respective conduit, particularly compared to the amount of heat transferred to the working fluid in the evaporator 200 and from the working fluid in the condenser 300.

In FIGS. 17 and 18, the evaporator 200 is configured to receive a liquid-phase of a working fluid from the liquid conduit 120 through an inlet 202 and to exhaust a vapor-phase of working fluid to the vapor conduit 110 through an outlet 204. As explained more fully below and shown schematically in FIG. 19, the evaporator 200 is configured to distribute the liquid-phase among a plurality of boiler channels 214 and to accumulate a vapor-phase of the working fluid from among the boiler channels in one or more vapor accumulators 215. And, the evaporator 200 is configured to convey the accumulated vapor-phase from the vapor accumulator 215 through a manifold 216. Referring again to FIGS. 17 and 18, the vapor phase passes from the vapor manifold 216 (FIG. 19) through the outlet 204 and into to the vapor conduit 110, which in turn conveys the vapor-phase to the condenser 300.

As the working fluid passes through the condenser 300, rejecting heat to another medium (not shown), the working fluid condenses to the liquid phase. The condensed working fluid passes from the condenser 300 into the liquid conduit 120 and returns to the evaporator 200. As FIGS. 17 and 18 show, the condenser 300 can be positioned remotely from the evaporator 200, similar to a more conventional pumped liquid cooling loop, providing design flexibility and reliable heat-transfer in many applications.

In some embodiments, the liquid conduit 120, the vapor conduit 110, or both, has two or more corresponding segments that can be coupled with and decoupled from each other. A loop thermosyphon that incorporates such a segmented conduit can provide further design and installation flexibility. For example, a segmented liquid-conduit, vapor-conduit, or both, for example, can permit a loop thermosyphon to be installed in a piecewise fashion, with the separate components being assembled at or near a point of use. Often, individual components are lighter and easier to maneuver as compared to a fully assembled loop thermosyphon, making a piecewise installation easier and more convenient than installation of a fully assembled loop thermosyphon.

Additionally, some embodiments of disclosed loop thermosyphons can be charged with a working fluid at a point of use during installation rather than at a factory during manufacturing. This can allow an end user to select from among different working fluids and can also make shipping less costly and installation relatively easier (even if a fully assembled thermosyphon is installed), as the installation technicians will not need to contend with the weight of the working fluid concurrently with maneuvering the loop thermosyphon into place.

Section II below describes principles pertaining to evaporators suitable for a loop thermosyphon and Section III describes principles pertaining to condensers. Sections IV and V, below, describe principles relating to conduits (including segmented conduits) and working fluids, respectively. Section IV describes aspects of certain system examples and Section VII describes aspects of certain other embodiments. Other, related principles also are disclosed throughout this disclosure.

VI.B. Evaporators

Turning now to FIGS. 19 through 25, aspects of a disclosed condenser are described.

Figure 19:
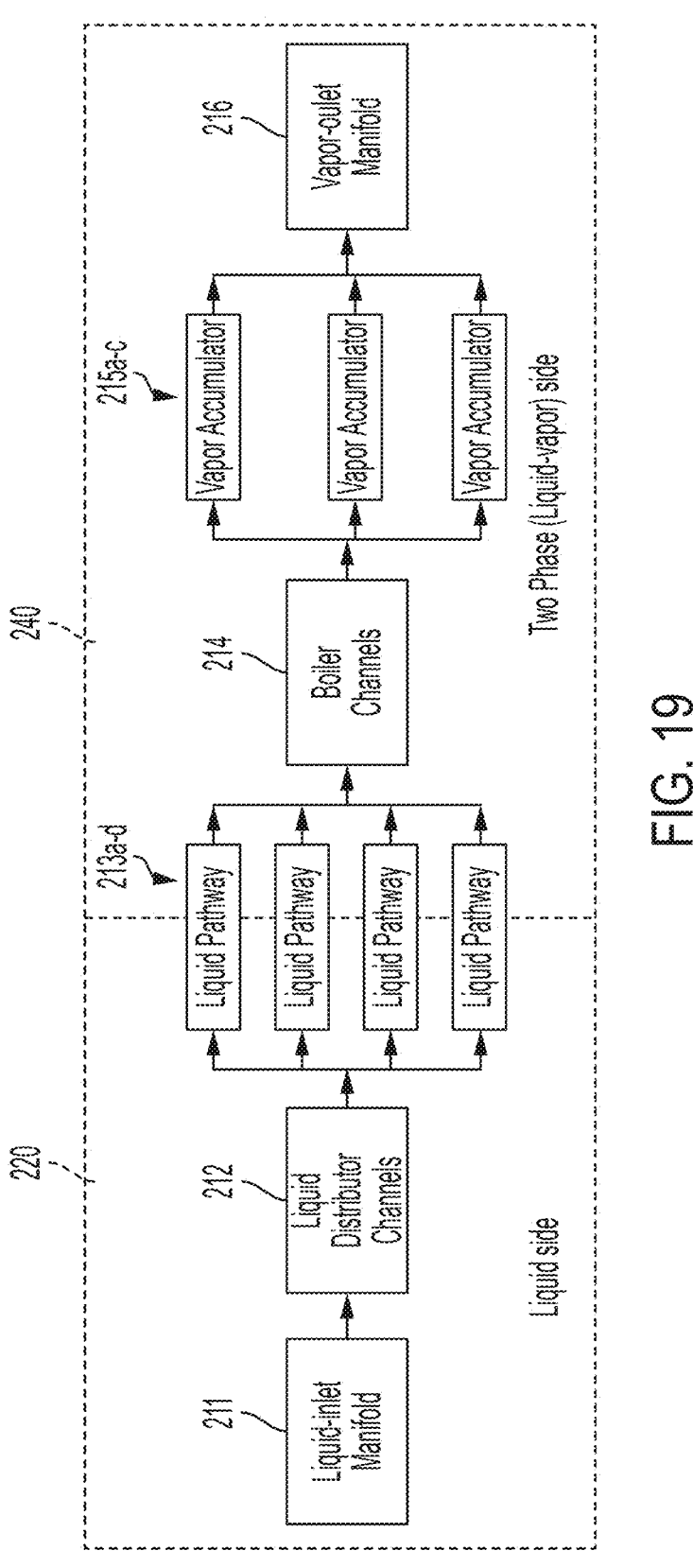
FIG. 19 schematically illustrates an architecture of an evaporator portion of a loop thermosyphon as in FIG. 17.

As FIG. 19 shows, after passing through the inlet 202 (FIGS. 17 and 18), a liquid phase of the working fluid enters a liquid-inlet manifold 211 that distributes the liquid phase among a plurality of liquid distributor channels 212. Each of the liquid distributor channels, in turn, conveys the working fluid (still predominantly or entirely in the liquid phase) to one or more liquid pathways 213a, 213b, 213c, 213d, which in turn convey the working fluid to a plurality of boiler channels 214. (Although four liquid pathways are indicated in the drawings, disclosed evaporators may have more or fewer such liquid pathways.) As explained more fully below, the working fluid, although perhaps heated to some degree while passing from the inlet 202 to the liquid pathways, absorbs substantial energy passing through the boiler channels 214. As the working fluid absorbs energy as latent heat in the boiler channels, it boils (e.g., vaporizes). The evaporator 200 has one or more vapor accumulators 215a, 215b, 215c that collect the vapor phase from the boiler channels. Accumulating the vapor phase in this manner can allow the working fluid to continue to flow through and absorb heat in the boiler channels without entering a so-called "dry-out" or "vapor-lock" condition within the boiler channels. The accumulated vapor enters a vapor-outlet manifold 216 from which the vapor exhausts through the vapor outlet 204 (FIGS. 17 and 18).

Figure 20:
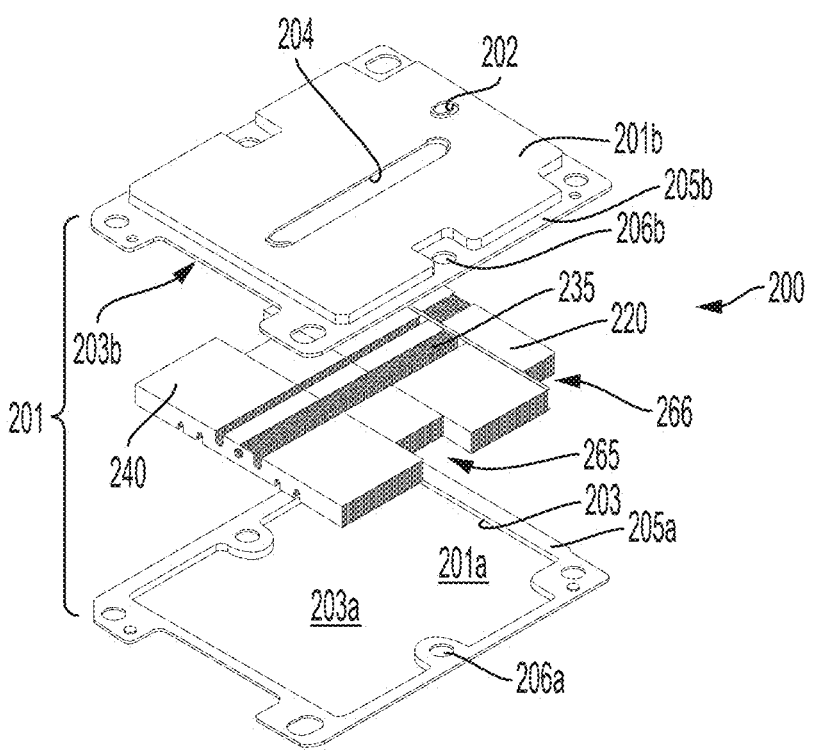
FIG. 20 shows an isometric, exploded view of the evaporator component of the loop thermosyphon in FIG. 17.

FIGS. 20 through 25 show an embodiment of an evaporator as depicted schematically in FIG. 19. In FIG. 20, the evaporator 200 has a housing 201 that defines a chamber 203 between a base 201a and a lid 201b. The base 201a, the lid 201b, or both, can be stamped from, e.g., a sheet of aluminum, or otherwise manufactured from a thermally conductive material. As shown in FIG. 20, one or both of the base 201a and the lid 201b can define a corresponding recessed region 203a, 203b surrounded by a corresponding peripheral flange 205a, 205b. The opposed recesses 203a, 203b have a complementary arrangement relative to each other so as to define the chamber 203 as the opposed peripheral flanges 205a, 205b are brought into a mating registration with each other as shown, for example, in the isometric view shown in FIG. 17. The flanges 205a, 205b also define complementary features (e.g., apertures through which corresponding fasteners can extend) suited to secure the flanges together. For example, in FIG. 20, the flanges 205a, 205b define a plurality of through-hole apertures 206*a*, 206*b* through which a fastener (e.g., a bolt) can extend, allowing the flanges to be urged toward each other in a sealing relationship. And, an O-ring or other gasket (not shown), or a curable sealant, can be positioned between the peripheral flanges 205*a*, 205*b* to further inhibit or altogether prevent leakage of working fluid from (or air or other non-condensable gas into) the chamber 203.

Figure 21:
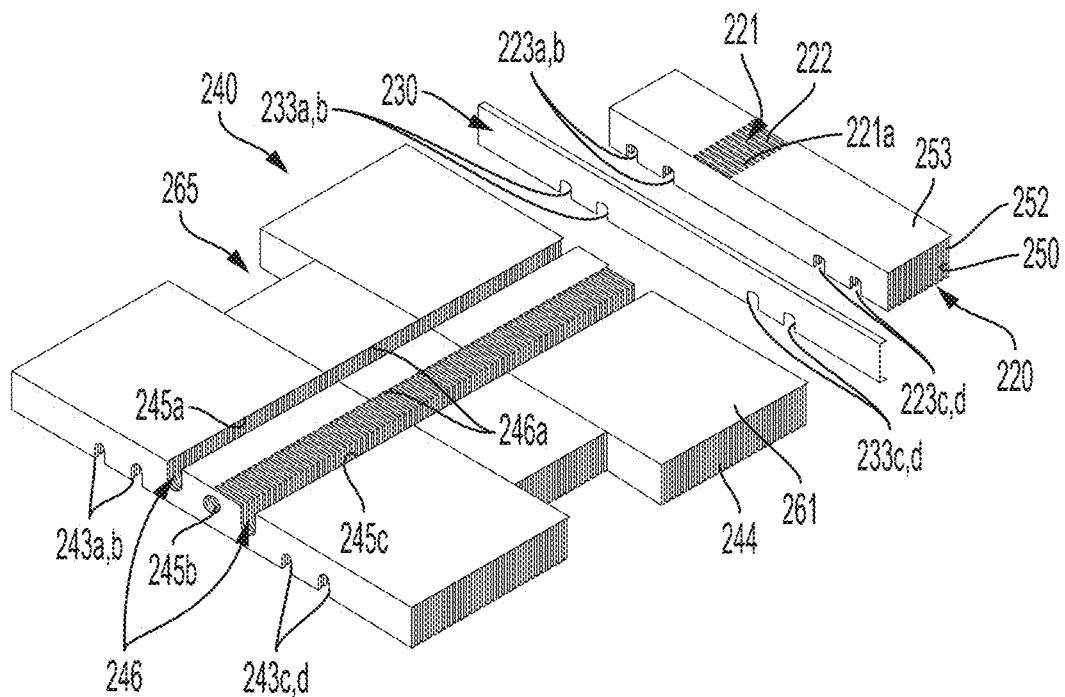
FIG. 21 shows an isometric, exploded view of the manifold structures in the evaporator shown in FIG. 20.

Within the chamber 203, the evaporator 200 has a first manifold member 220 and a second manifold member 240 (also shown schematically in FIG. 19) separated from each other by one or more separators 230. The first manifold member 220 is configured to distribute the liquid-phase that entered the chamber 203 through the liquid inlet 202 from the liquid conduit 120 (FIGS. 17 and 19) among a plurality of liquid pathways 213*a-d* (FIG. 19). In FIG. 21, the liquid pathways 223*a-d* are analogous to the liquid pathways 213*a-d* shown in FIG. 19. The second manifold member, in turn, is configured to (1) distribute the working fluid among a plurality of boiler channels 214 from the plurality of liquid pathways; (2) transfer heat to the working fluid, causing it to boil in the boiler channels 214; and (3) collect the vapor phase from among the boiler channels to allow it to exhaust through the vapor outlet 204.

More particularly, in the embodiment shown in FIGS. 20-25, the first manifold member 220 defines a liquid-inlet manifold 221. The inlet manifold 221 receives the liquid phase from the liquid inlet 202 and distributes the liquid among a first plurality of fluid-distribution channels 222. For example, as shown in FIG. 21, the fluid-distribution channels 222 can be defined between a corresponding plurality of spaced-apart fins 250. Each of the fins 250 can have a proximal edge 251 (FIG. 22) positioned adjacent and thermally coupled with the base 201*a* of the housing 201 and distal edge 252 (FIG. 22) positioned adjacent and thermally coupled with the lid 201*b*. For example, the fins 250 can be defined by a corrugated sheet of thermally conductive material, such that every other corrugation adjacent the proximal edges of the fins can be thermally coupled with the base 201*a* and the intervening corrugations 253 positioned adjacent the distal edges of the fins can be thermally coupled with the lid 201*b*.

A brazing or other joining technique (e.g., controlled area brazing, soldering) can provide such thermal coupling. Of course, such folded fins are just an example; many manufacturing techniques are available for providing spaced-apart fins that define the fluid-distribution channels and any of them may be suitable for manufacturing the first manifold member 220. For example, an array of plate fins can extend from a base member (not shown) adjacent the proximal fin edges to a cap member adjacent the distal fin edges, enclosing the liquid distributor channels. In still other embodiments, the fins 250 are continuous with the base 201*a* or the lid 201*b* (or both).

As FIGS. 20 and 21 show, a region 221*a* of the upper corrugations 253 of the first manifold member 220 can be removed to expose the liquid distributor channels 222 to the flow of working fluid received through the liquid inlet 202. For example, the region 221*a* can be generally aligned with the liquid inlet 202, defining a liquid-inlet manifold 221 configured to distribute incoming liquid among the liquid distributor channels 222. The liquid distributor channels 222, in turn, can convey the working fluid laterally outward (depicted by arrows 256 in FIG. 22) of the liquid-inlet manifold 221 to each of a plurality of liquid pathways 223*a*, 223*b*, 223*c*, 223*d*. The liquid pathways 223*a*, 223*b*, 223*c*, 223*d* can be oriented transversely relative to the liquid distributor channels 222 and the fins 222*a* so as to convey the working fluid from the first manifold member 220 toward the second manifold member 240.

As also shown in FIGS. 20 and 21, the plurality of liquid pathways 223*a*, 223*b*, 223*c*, 223*d* can be a first plurality of liquid pathways. The second manifold member 240, in turn, can define a second plurality of corresponding liquid pathways 243*a*, 243*b*, 243*c*, 243*d*. Each of the illustrated second plurality of liquid pathways 243*a*, 243*b*, 243*c*, 243*d* is fluidly coupled with and extends from a corresponding one of the first plurality of liquid pathways 223*a*, 223*b*, 223*c*, 223*d* (e.g., second pathway 243*a* extends from first pathway 223*a*, etc.). Stated differently, each in the second plurality of liquid pathways 243*a-d* can receive the working fluid (e.g., liquid, vapor, or a mixture of liquid and vapor) from a corresponding one or more of the first plurality of liquid pathways 223*a-d*.

Figures 22, 23, 24, 25:
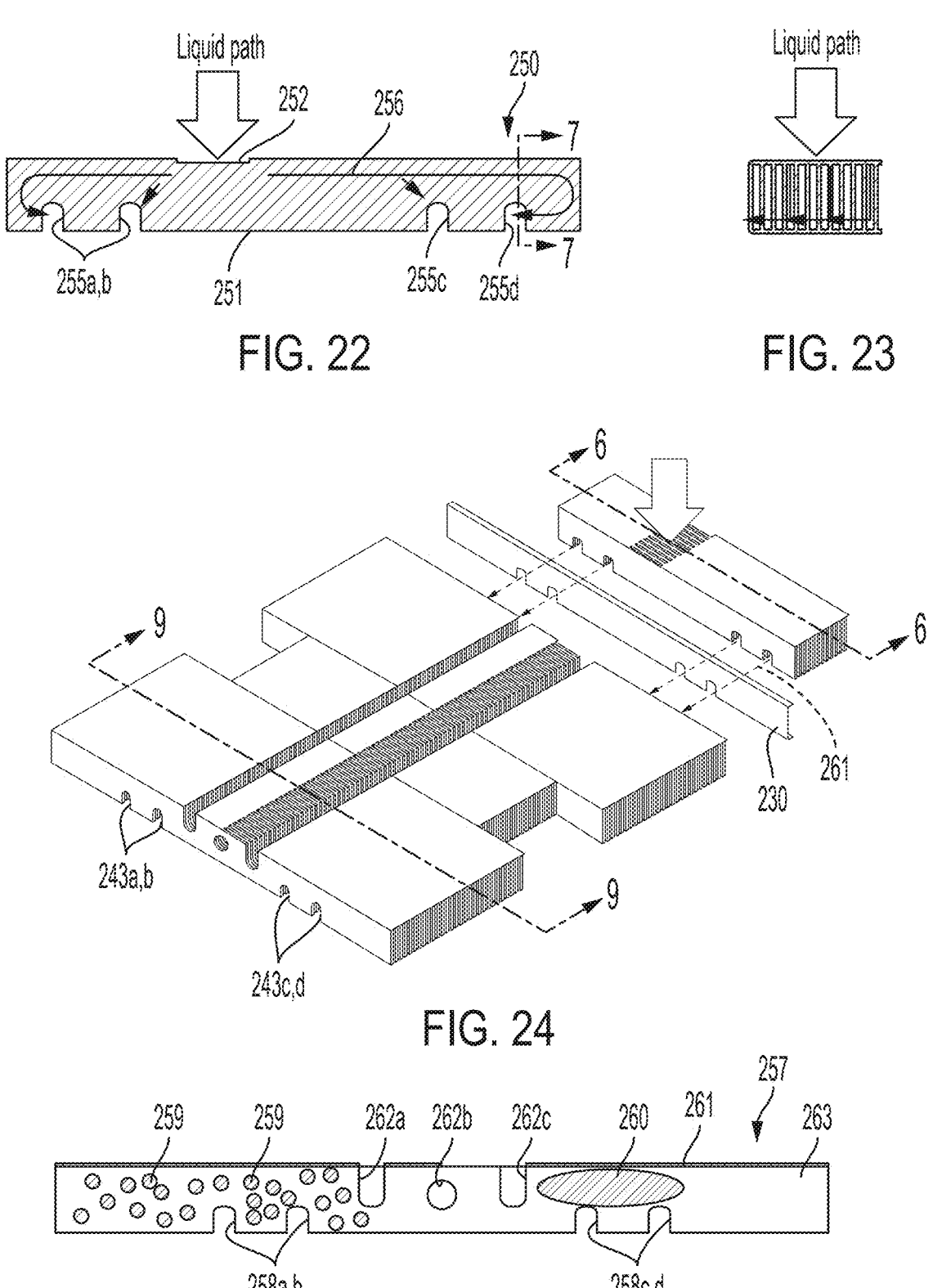
FIG. 22 shows a cross-sectional, side-elevation view of a liquid distribution manifold in FIG. 21.
FIG. 23 shows a cross-sectional, end-elevation view of the liquid distribution manifold in FIG. 21.
FIG. 24 shows an annotated version of FIG. 21 illustrating a flow of a working fluid through regions of the manifold structures.
FIG. 25 shows a cross-sectional, side-elevation view of the vaporization manifold in FIG. 21.

By way of example, as shown in FIG. 22, the proximal edge 251 of each fin 250 in the first manifold member 220 can define a recess 255*a-d* corresponding to each in the plurality of liquid pathways 223*a*, 223*b*, 223*c*, 223*d*. The recesses 255*a-d* defined by adjacent fins 250 can be in alignment with each other, allowing the working fluid (depicted by the arrow 256) flowing between the fins 255 in the liquid distributor channels 222 to enter the liquid pathways 223*a-d* and to flow transversely relative to the fins 250 along the liquid pathways 223*a*, 223*b*, 223*c*, 223*d*, e.g., through the aligned recesses 255*a-d* of each fin as generally depicted in FIG. 23.

Referring again to FIGS. 20 and 21, similar to the first manifold member 220, the second manifold member 240 can have a plurality of spaced-apart fins 257. Like the fins 250 of the first manifold member 220 shown in FIG. 22, the fins 257 of the second manifold member 240 can have a proximal edge positioned adjacent and thermally coupled with the base 201*a* of the housing 201 and distal edge 252 positioned adjacent and thermally coupled with the lid 201*b*. The fins 257 can be manufactured and/or assembled with the housing 201 of the evaporator 200 in a manner as described above in connection with the fins of the first manifold member 220.

Further, as shown in FIGS. 24 and 25, the proximal edge of each fin 257 in the second manifold member 240 can define a recess 258*a-d* corresponding to each in the plurality of liquid pathways 243*a*, 243*b*, 243*c*, 243*d*. The recesses 258*a-d* defined by adjacent fins 257 can be in alignment with each other, allowing the working fluid received from the first manifold member 220 (e.g., depicted in arrows 261 in FIG. 24) to penetrate into the second manifold member 240 transversely relative to the fins 257.

Note that the illustrated embodiment shown in FIGS. 20-25 has a one-to-one correspondence between the number of liquid pathways in the first plurality (e.g., the first manifold member 220) and the number of liquid pathways in the second plurality (e.g., the second manifold member 240). However, in other embodiments, the first plurality of liquid pathways may have more or fewer than the number liquid pathways in the second plurality. That being said, each in the second plurality of liquid pathways receives the working fluid from one or more corresponding liquid pathways in the first plurality, and each in the first plurality of liquid pathways delivers the working fluid to one or more corresponding pathways in the second plurality.

Also shown in FIGS. 20, 21 and 24 is a separator 230 positioned between the first manifold member 220 and the second manifold member 240. The separator 230 defines one or more liquid pathways 233*a-d* coupling the liquid pathways 223a-d defined by the first manifold member 220 with the liquid pathways 243a-d defined by the second manifold member 240. Although the illustrated separator defines a number of liquid pathways 233a-d in one-to-one correspondence with the number of liquid pathways 223a-d defined by the first manifold member 220 and liquid pathways 243a-d defined by the second manifold member 240, in other embodiments, the separator 230 can be configured as an intervening manifold structure configured to distribute working fluid from one of the liquid pathways defined by the first manifold member 220 among a plurality of the liquid passageways defined by the second manifold member. Conversely, the separator 230 can be configured as an intervening manifold structure configured to accumulate working fluid from among the plurality of liquid passageways defined by the first manifold member 220 and to convey the accumulated working fluid to a lesser number of a liquid passageways defined by the second manifold member 240.

In the embodiment shown in FIGS. 4, 5 and 8, the separator 230 comprises one or more fins, each defining a plurality of recesses from the proximal edge corresponding to the plurality of liquid pathways defined by the first manifold member 220 and the second manifold member 240. However, when the number of liquid pathways defined by the first manifold member 220 differs from the number of liquid pathways defined by the second manifold member 240, the separator fin(s) positioned adjacent the first manifold member can define a number of recesses corresponding to the number of liquid pathways defined by the first manifold member. Similarly, the separator fin(s) positioned adjacent the second manifold member can define a number of recesses corresponding to the number of liquid pathways defined by the second manifold member, allowing the working fluid to flow in a direction transverse to the fins of the separator, distributing or accumulating working fluid within the separator before flowing into the second manifold member.

Referring still to FIGS. 20, 21 and 24, the second manifold member 240 also defines a plurality of boiling channels 244 extending transversely relative to and fluidly coupled with the second plurality of liquid pathways 243a-d. For example, as noted above, the second manifold member 240 can have a plurality of spaced-apart fins 257 defining the boiling channels 244 between adjacent ones of the fins. As the working fluid flows through the second plurality of liquid pathways 243a-d defined by the second manifold member 240 and across the fins 257, the working fluid can flow into the boiling channels 244. While passing through the boiling channels, the working fluid can absorb heat through the base 201a of the housing and the fins 257, causing the working fluid to boil within the boiling channels 244. In FIG. 25, the resulting vapor phase is depicted by the circles 259 and oval 260 (e.g., representing bubbles of vapor phase within the liquid phase).

The illustrated embodiment of the second manifold member 240 defines a plurality of vapor accumulators 245a, 245b, 245c, similar in function to the one or more vapor accumulators 215a, 215b, 215c described above. Similar in construction to the liquid pathways 243a-d, described above, each vapor accumulator 245a, 245c can be defined by recesses defined by the fins 257. For example, as shown in FIG. 25, each fin 257 (or a subset of them) can define a recess 262a, 262c from a distal edge 263 (e.g., opposite the edge that defines the recesses 258a-d), and the respective recesses 262a, 262c defined by the plurality of fins 257 of the second manifold member 240 can be aligned with each other, defining corresponding channels (i.e., the vapor accumulators 245a, 245c) extending across the fins 257. As well, or alternatively, each fin 257 (or a subset of them) can define an aperture, or notch, 262b. The apertures (or notches) 262b can be aligned with each other, defining a vapor accumulator 245b extending through the fins 257. As noted above, accumulating the vapor phase in this manner can allow the working fluid to continue to flow through and absorb heat in the boiler channels 244 without entering a so-called "dry-out" or "vapor-lock" condition within the boiler channels. Dry-out or vapor lock conditions reduce the effectiveness of the evaporator to absorb heat because the flow of liquid-phase through the vapor-locked channels 244 ceases, preventing the working fluid from absorbing latent heat and further boiling.

As with the first manifold member 220, the second manifold member 240 can define an upper and/or a lower cap 261 (e.g., as provided by corrugations similar to the corrugations 253 described above) enclosing the boiling channels 244. As well, such a cap can provide an interface region for thermally coupling the second manifold member 240 with the base 201a or lid 201b in a manner as described above in connection with the corrugations 253.

And, similar to the first manifold member 220, the second manifold member can have a region 246a of the cap removed, defining a vapor-outlet manifold 246. Accumulated vapor phase enters the vapor-outlet manifold 246 from which the vapor exhausts through the vapor outlet 204 (FIGS. 17 and 18). The outlet 204 defined by the housing 201 can be aligned with the vapor-outlet manifold 246, fluidly coupling the vapor conduit 110 (FIGS. 17 and 18) with the vapor-outlet manifold 246 defined by the second manifold member 240. For example, each boiling channel 244 can have a corresponding region of the cap 261 removed, exposing the boiling channel and defining a vapor outlet therefrom. Taken together, the vapor outlet from each boiling channel 244 defines an inlet to the vapor-outlet manifold 246. The vapor outlet 204 defined by the housing 201 can extend across more than one of the open regions of the boiling channels 244.

In FIG. 24, the vapor-outlet manifold 246 is defined by a recess or notch 262a, 262b (FIG. 25) from a distal edge of the fins defining the boiling channels 244. (In this context, the "distal edge" refers to the edge of the fins that are spaced apart from the base 201a of the evaporator 201. By contrast, a "proximal edge" of the fins is in thermal contact with or formed continuously from the interior surface 203a of the base 201a.) The vapor-outlet manifold 246, which spans across the boiling channels 244, releases pressure from the boiling channels 244 that arises in the boiling process. Stated differently, the vapor-outlet manifold 246 acts as an accumulator, e.g., region with a relatively a large volume (compared to the volume of a given boiling channel) which can collect a primarily vapor-phase of the working fluid. Alternatively, a notch or through-hole in each fin can be aligned with adjacent notches or through-holes to define an accumulator 245b. The accumulators 245b and 246 can be spaced from the base 201a of the evaporator to allow more fin material closer to the base 201a to enhance heat transfer (e.g., to maintain high fin-efficiency).

As shown by way of example in FIG. 20, the second manifold member 240 can define a laterally recessed region 265. The laterally recessed region corresponds to a contour of the peripheral flanges 205a, 205b defined by the housing 201. Similarly, the first manifold member 220 defines a recessed region 266 corresponding to an inward projection of the peripheral wall. Unlike the embodiment shown in FIG. 20, some embodiments of an evaporator do not have bends or other inward protrusions defined by the peripheral wall of the chamber 203 enclosing the manifold members 220, 240, and thus do not have a corresponding recessed region 265. In other embodiments, the peripheral wall defines an inward protrusion extending transverse relative to the fins 257 rather than longitudinally of them as in FIG. 20. In those embodiments, some fins 257 (or the fins 252 of the first manifold member) may be interrupted, providing shorter boiling channels (or liquid-distributor channels).

As noted above, an electrical component 501 can be thermally coupled with an external surface of the base 201a of the evaporator housing 201 (FIG. 20). In some applications, a major surface of the electrical component 501 can be substantially smaller than the external major surface of the base 201a that is in thermal contact with the electrical component. And, in some evaporator embodiments, the base 201a is formed from a relatively thin, conductive metal, e.g., aluminum (or other material compatible with a suitable working fluid). Although a thin, conductive base 201a can facilitate conductive heat transfer transversely through the base 201a, a substantial difference between the area of the electrical component 501 and the area of the base 201 can introduce a non-negligible thermal-spreading-resistance. Such a thermal-spreading-resistance can limit some embodiments' overall thermal resistance. Stated differently, even if the thermosyphon's overall thermal resistance is very low, the thermal resistance from the chip to the ultimate heat sink may be dominated by the spreading resistance.

Some disclosed evaporators incorporate an augmented thermal contact for spreading heat from a concentrated area (e.g., a region of high heat flux, such as, for example, a small electrical component) to a larger area (e.g., a major surface of the base 201a). Other embodiments incorporate an augmented thermal contact for spreading heat from a region positioned off-center of the evaporator to the rest of the evaporator. For example, some system designs may make it preferable to position a component-to-be-cooled off-center relative to the evaporator 201. With such an embodiment, an evaporator base 201 having an augmented thermal contact can efficiently spread the heat from the component to the remainder of the evaporator.

Figure 20A:
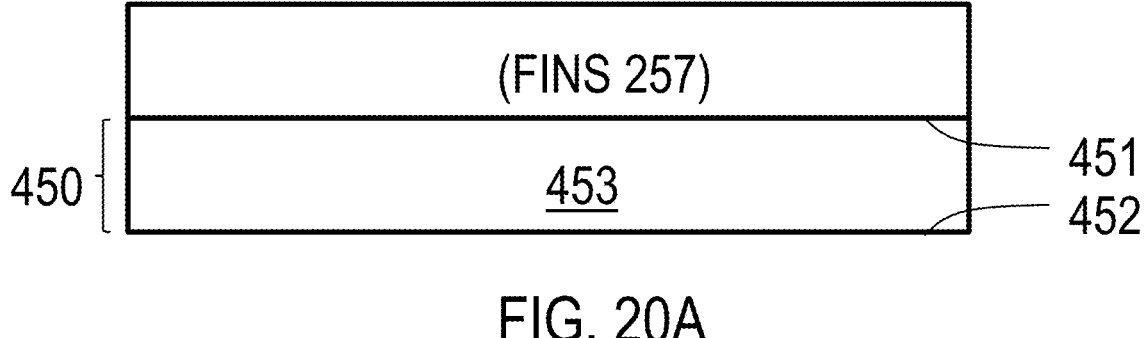

In one embodiment, the augmented thermal contact can simply be a layer of material that exhibits significantly higher thermal conductivity than the material (e.g., aluminum or copper) from which the evaporator base 201a is made. For example, if the evaporator base is made of aluminum (which is compatible with some refrigerants), copper cladding on the major surface of the base 201a can form the augmented thermal contact. Of course, other materials that exhibit high thermal conductivity also can be used in combination with an aluminum evaporator base (e.g., diamond, carbon nanotubes, etc.). In some embodiments, a material that provides non-homogeneous thermal conductivity can form an augmented thermal contact. For example, some materials (e.g., carbon nanotubes) can exhibit high in-plane thermal conductivity with lower through-plane conductivity. Such materials can still be useful if the lateral thermal conductivity is sufficiently high as to conduct heat laterally and if the material is thin enough that the through-plane thermal resistance remains relatively low. Another augmented thermal contact embodiment is an oscillating heat pipe (OHP). For example, an OHP can be soldered to the base 201a of the evaporator. In another embodiment, the base 201a of the evaporator forms a common wall with an OHP 450 (FIG. 20A).

Figure 20B:
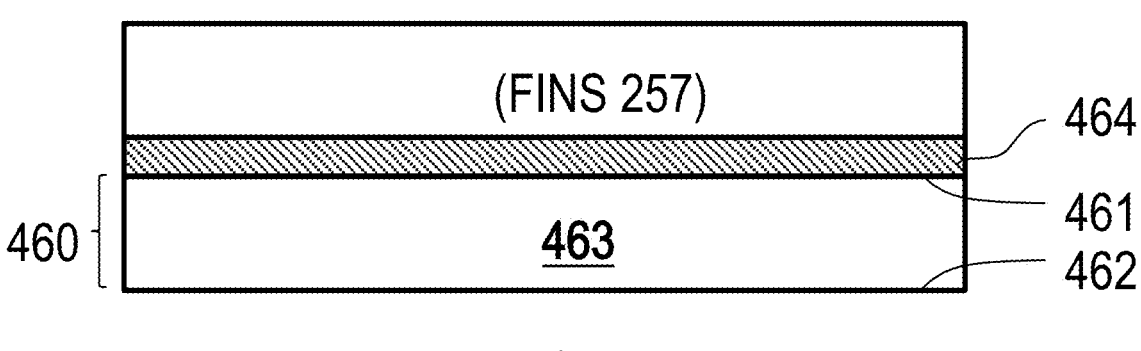

For example, referring again to FIG. 20A, the major surface 451 of the base 201a positioned opposite the recessed region 203a can form an internal surface of an OHP 450. That is to say, another sheet of material 452, similar to the base 201a, can attach to the underside of the base 201a of the evaporator, defining an internal gap or chamber 453 between the base 201a and the other sheet of material. The internal gap or chamber 453, which may include a wick structure (not shown), can define the volume through which the working fluid of the OHP 450 transits. Moreover, an evaporator 201 with such a stratified base as in FIG. 20A can enjoy a low spreading resistance provided by the OHP 450 and eliminate a through-plane resistance of solder 464 or other material that would otherwise be present at the interface between the base 201a and a stand-alone OHP 460 that is affixed to the underside of the base 201a as in FIG. 20B. In FIG. 20B and in contrast to the embodiment in FIG. 20A, the upper wall 461 is a distinct component from the base 201a. In FIG. 20B, a lower wall 462 is positioned opposite the upper wall 461 relative to the internal gap or chamber 463, which may include a wick structure (not shown) and can define the volume through which the working fluid of the OHP 460 transits.

VI.C. Condensers

Figure 26:
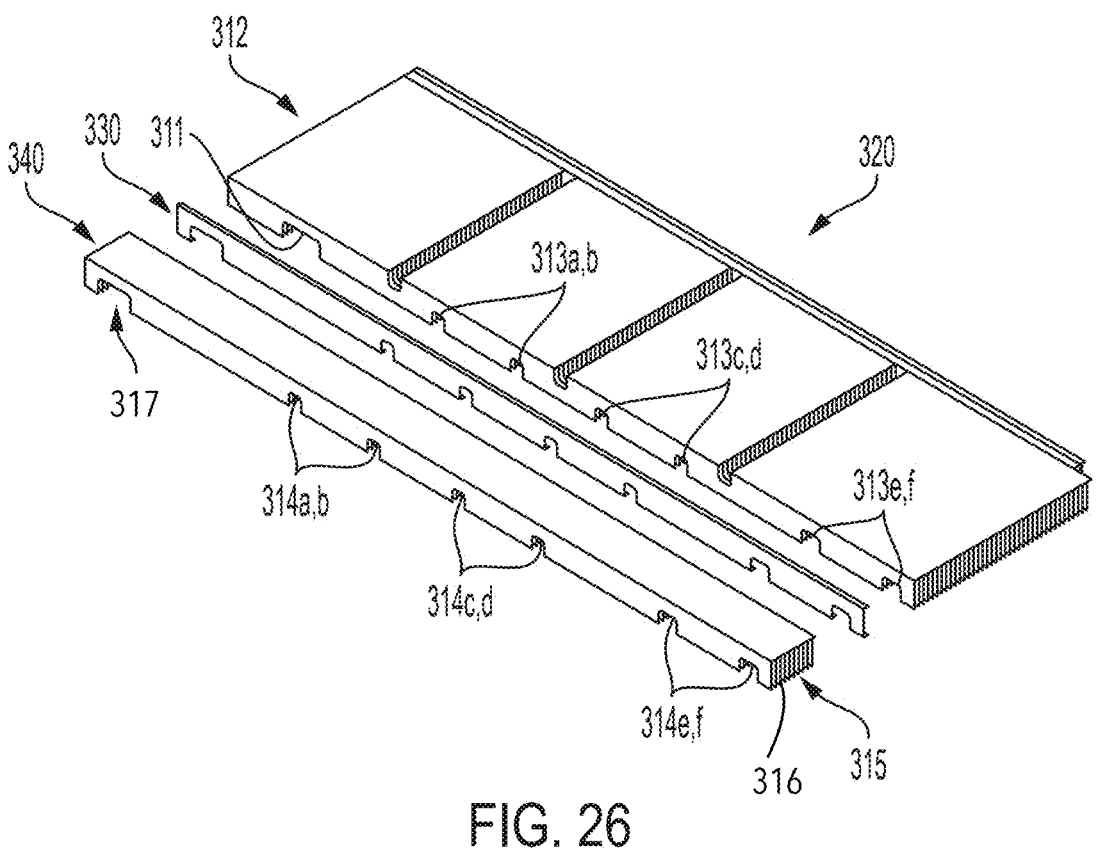
FIG. 26 shows an isometric, exploded view of the manifold structures in the condenser shown in FIGS. 17 and 18.

Turning now to FIGS. 26 through 29, aspects of a disclosed evaporator are described. As FIG. 26 shows, the condenser 300 has a first manifold member 320 and a second manifold member 340. A separator 330 is positioned between the first manifold member and the second manifold member.

Figure 27:
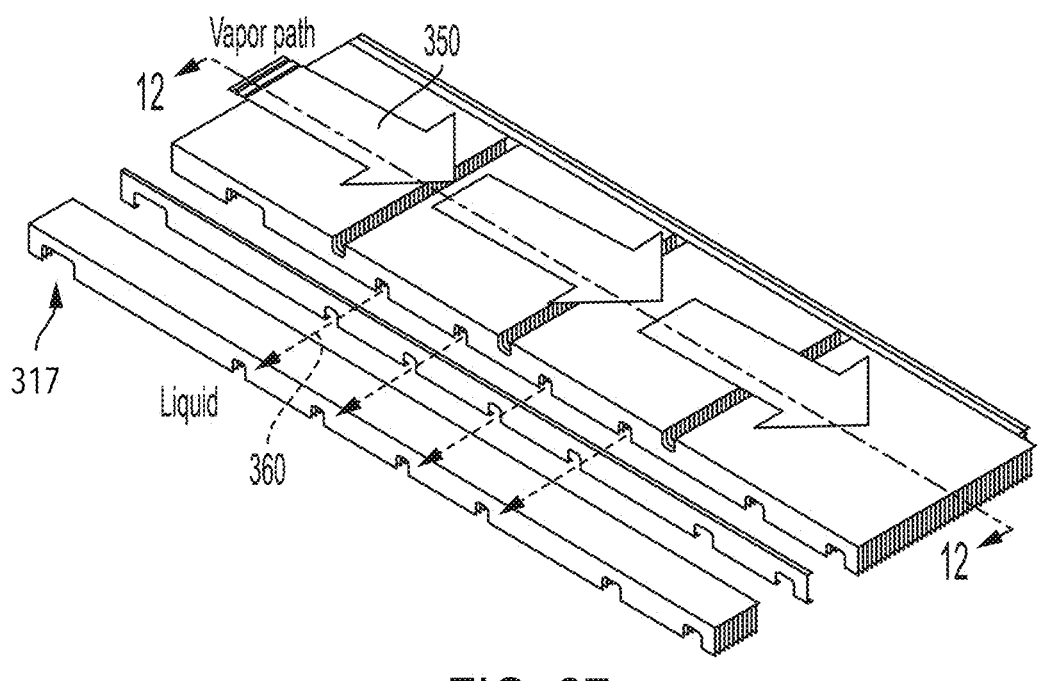
FIG. 27 shows an annotated version of FIG. 26 illustrating a flow of the working fluid through regions of the condenser manifolding structures.
Figure 28:
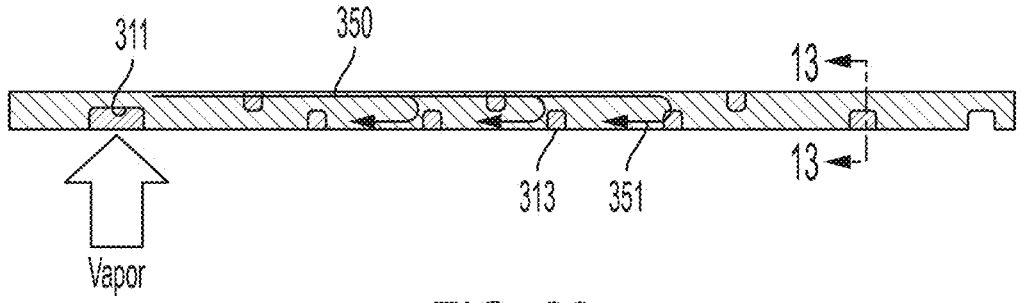
FIG. 28 shows a cross-sectional, side-elevation view of the condensing manifold structure shown in FIG. 26.
Figure 29:
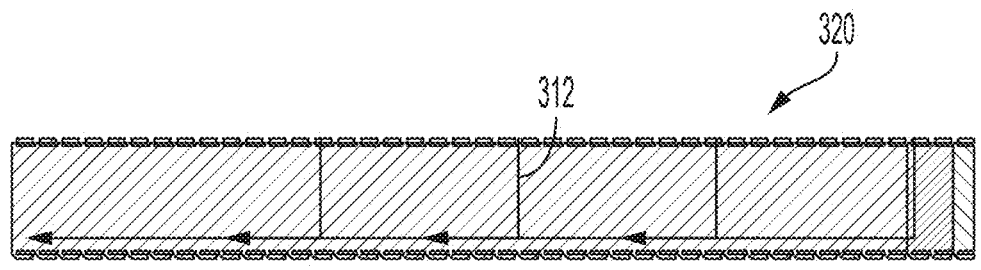
FIG. 29 shows an end-elevation view of the condensing manifold structure shown in FIG. 26.

After passing from the vapor conduit 110 through the inlet 302 (FIGS. 17 and 18), a vapor phase of the working fluid enters a vapor-inlet manifold 311 that distributes the vapor phase among a plurality of condensing channels 312 defined by the condenser 300. Each of the condensing channels 312, in turn, conveys the working fluid along the condenser, still predominantly or entirely in the vapor phase, as depicted by the arrow 350 (FIGS. 27 and 28). The working fluid, rejects substantial energy as latent heat it passes through the condensing channels 312, causing the vapor phase to condense to the liquid phase.

As the vapor phase condenses, the liquid-phase of the working fluid accumulates as indicated schematically by the segment 351 of the arrow 350. As the liquid phase accumulates within the condensing channels 312, it flows to one or more of a first plurality of liquid pathways 313a-313f oriented transversely relative to the condensing channels 312 and the fins defining those channels. The first plurality of liquid pathways 313a-313f, in turn, convey the working fluid to a second plurality of corresponding liquid pathways 314a-314f defined by the second manifold member 340, as the arrows 360 indicate. (Although six liquid pathways are indicated in the drawings, disclosed condensers may have more or fewer such liquid pathways.) Accumulating the liquid phase in or among the liquid pathways 313a-f can allow the working fluid to continue to flow through and reject heat in the condensing channels without clogging the channels with liquid.

The accumulated liquid passes into the second manifold member 340 along the liquid pathways 314a-f and enters liquid-conveyance channels 315 between adjacent fins 316 of the second manifold member. In turn, the liquid-conveyance channels 315 open to a liquid-outlet manifold 317 from which the liquid exhausts through the liquid outlet 304 and into the liquid conduit 120 (FIGS. 17 and 18).

In the embodiment shown among FIGS. 26-29, the first manifold member 320 and the second manifold member 340 includes a respective plurality of spaced-apart fins of the type described above in connection with the first manifold member 220 and second manifold member 240 of the evaporator 200. Similar to the liquid pathways 243*a-d*, the liquid pathways 313*a-f* and 314*a-f* can be defined by a recessed fin edge, as shown in FIGS. 26 through 28.

Like the evaporator 200, the condenser 300 includes a separator 330. The separator 330 is configured similarly to the separator 230. And, like the separator 230, the separator 330 can define an intervening manifold in the event the first manifold member 320 has more or fewer liquid pathways 313 than the second manifold member 340 has liquid pathways 314.

VI.D. Conduits

As indicated in FIGS. 17 and 18, the liquid conduit 120, the vapor conduit 110, or both, of some thermosyphons incorporate a solid-walled tube (e.g., a stainless steel or copper tube) to convey the working fluid. In other embodiments, one or both of the liquid conduit 120 and the vapor conduit 110 incorporate a flexible tubular structure to convey the working fluid. For example, a flexible conduit can include a flexible, polymer-based tube to convey the working fluid. In some embodiments, such a flexible tube has a braided or other woven structure (e.g., braided or woven metal filaments) overlying an external surface of the tube. Such an outer structure can maintain a degree of flexibility for the conduit while also inhibiting kinking or other buckling of the inner tube, as kinking or buckling of the inner tube can inhibit flow of a working fluid through the tube. As well, the outer structure can retain an outer contour of the inner tube, inhibiting or preventing the inner tube from expanding, bulging or even rupturing from the pressure of the working fluid passing through the conduit. Other embodiments include a braided or other woven structure embedded in the flexible wall of the conduit.

A liquid conduit, a vapor conduit, or both, can be divided into corresponding segments. For example, referring now to FIG. 30, the loop thermosyphon 400 incorporates a liquid conduit 420 and a vapor conduit 410 that each have two or more corresponding segments that can be coupled with and decoupled from each other. For example, the two segments 421, 422 of the liquid conduit 420 can be fluidly coupled with and fluidly decoupled from each other. Similarly, the two segments 411, 412 of the vapor conduit 410 can be fluidly coupled with and fluidly decoupled from each other.

By way of further example, the segment 421 can include a first coupler 423 and the other segment 422 can include a second coupler 424. The second coupler 424 can have a configuration complementary to that of the first coupler 423. More specifically, the segment 421 extends from a proximal end fluidly coupled with the liquid inlet 202 of the evaporator 200 to a distal end having the first coupler 423. Similarly, the segment 422 extends from a proximal end fluidly coupled with the liquid outlet 304 from the condenser to a distal end having the second coupler 424. In an embodiment, the first coupler 423 and the second coupler 424 are matingly engageable with and disengageable from each other, as with, for example, male and female quick-disconnect couplers.

Similarly, the first and second segments 411, 412 of the vapor conduit 410 can have respective first and second couplers 413, 414 that are matingly engageable with and disengageable from each other. For example, the first segment 411 can extend from a proximal end fluidly coupled with the vapor outlet 204 of the evaporator 200 to a distal end having the first coupler 413, and the second first segment 412 can extend from a proximal end fluidly coupled with the vapor inlet 302 of the condenser 300 to a distal end having the second coupler 414. The first coupler 413 and the second coupler 414 can be matingly engageable with and disengageable from each other, as with, for example, male and female quick-disconnect couplers.

A loop thermosyphon that incorporates one or more segmented conduits as just described can provide further design and installation flexibility for a loop thermosyphon.

And, a segmented conduit can make installation easier or more convenient in some applications. For example, a loop thermosyphon that will be installed in or on a tower can be hoisted aloft in separate components and assembled at or near the point of use rather than hoisted as a complete assembly. Individual components are lighter and often easier to maneuver as compared to a fully assembled loop thermosyphon.

Additionally, a segmented conduit having matingly engageable and disengageable fluid couplers can be used to charge a loop thermosyphon with a working fluid. For example, a first segment of, for example, a liquid conduit, can be fluidly coupled with an external source of a working fluid. A second segment of, for example, the liquid conduit may be fluidly couplable with the first segment, except during charging the second segment can be fluidly coupled to a waste tank or other device configured to capture excess working fluid during charging.

Once both segments are connected as just described, working fluid can be supplied to the first segment and allowed to flow into the loop thermosyphon. Concurrently with allowing the working fluid to flow into the loop thermosyphon, non-condensable gas can exhaust from the loop thermosyphon through the second segment and into the waste tank or other fluid-capture device. Once the non-condensable gas has been replaced throughout the thermosyphon by working fluid, the supply of working fluid can be discontinued, and the first segment and the second segment can be disconnected from the source of working fluid and the fluid-capture device, respectively. After such disconnection, the first segment and the second segment can be fluidly coupled with each other, providing a continuous circuit of working fluid throughout the loop thermosyphon.

VI.E. Working Fluids

Any suitable working fluid, or refrigerant, now know or hereafter developed can be used in a loop thermosyphon of the type described herein. Desirably, such a working fluid for a loop thermosyphon provides one or more of a large difference in fluid density between the gas phase and the liquid phase, relatively high latent heat, and a moderate saturation pressure, particularly at or near a desired range of operating temperatures for the working fluid in a given application. For example, some electronic components have an upper threshold temperature of about 85° C. Consequently, a working fluid in a thermosyphon may operate at or near 85° C. when used to cool such an electronic component. Other components, of course, have different upper threshold temperatures, and thus a working fluid in a thermosyphon used to cool these other components may operate at or near a temperature other than 85° C.

As noted above, the difference in density between the vapor phase and the liquid phase, combined with a difference in elevation between the evaporator and the condenser, results in forces that urge the flow of working fluid through a given loop thermosyphon. Consequently, for a given elevation difference, a relatively larger difference in density between the vapor phase and the liquid phase will provide a relatively higher flow rate of working fluid through the thermosyphon.

Examples of working fluids suitable for use in a thermosyphon include R-134a, R-1234yf, and mixtures thereof. That being said, the American Society of Heating, Refrigerating and Air-Conditioning Engineers (ASHRAE) maintains a compendium of hundreds of refrigerants and their physical properties. Any such refrigerant or analog thereto may be used as a working fluid in a disclosed thermosyphon. A person of ordinary skill in the art following a review of this disclosure will understand and appreciate how to select and incorporate any such refrigerant in a loop thermosyphon of the type described herein without undue experimentation.

VI.F. System Examples

Figure 31:
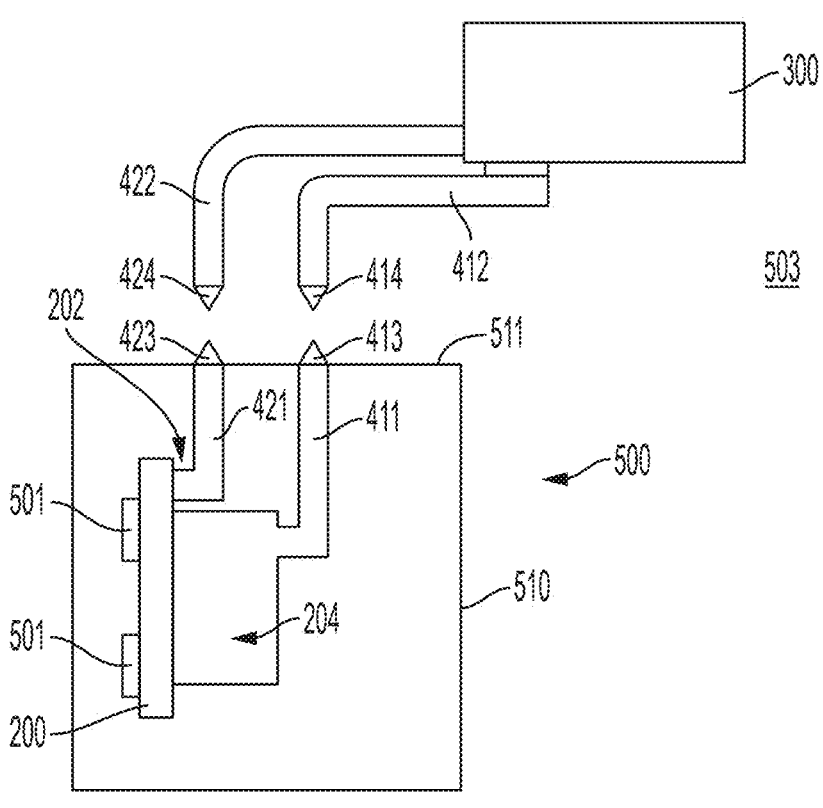
FIG. 31 shows an electrical device incorporating a loop thermosyphon as shown in FIG. 30.

FIG. 31 shows an electrical device having one or more components cooled by a loop thermosyphon of the type described herein. The illustrated electrical device 500 has first and second electrical components 501 that dissipate heat during operation and have an upper temperature threshold for reliable operation. By way of example, the electrical device 500 is placed in and protected from an environment 503 by a housing, or chassis, 510.

Figure 30:
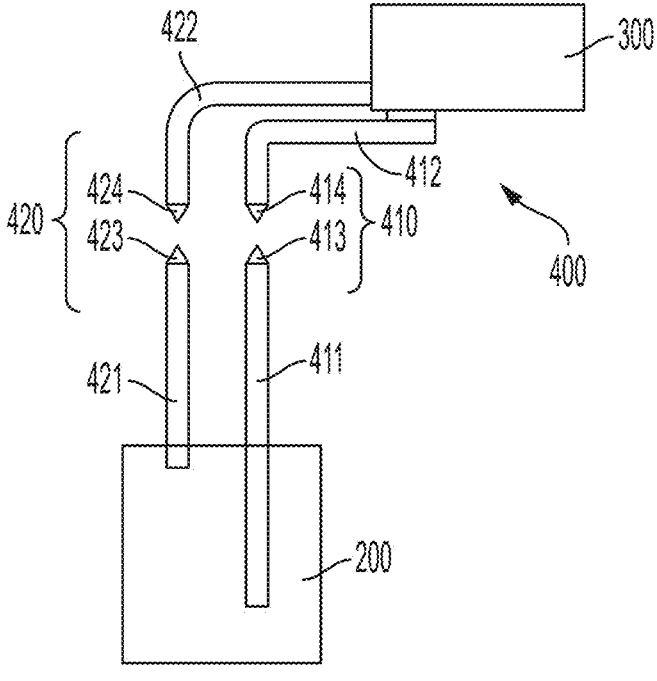
FIG. 30 shows another embodiment of a loop thermosyphon.

The electrical components 501 are thermally coupled with and cooled by a loop thermosyphon, e.g., the loop thermosyphon 400 shown in FIG. 30. More specifically, the electrical components 501 are thermally coupled with an external surface of the base 201a of the evaporator housing 201 (FIG. 20). For example, a thermal interface material, e.g., a thermally conductive grease, pad, gel, solder, etc., can be disposed between the heat-transfer surface of the evaporator and a corresponding heat-transfer surface defined by the electrical components 501. Although two electrical components 501 are shown in FIG. 31, an electrical device can have just one electrical component 501 or can have 2, 3, 4, 5, 6, 7, 8 or more electrical components 501 cooled by the loop thermosyphon 400. Moreover, the electrical components 501 may be substantially identical to each other, or one or more of the electrical components can be different from one or more of the other electrical components. Further, a group more than one of the electrical components 501 can be packaged together (e.g., as part of a multi-chip module). Still further, other of the electrical components 501 can be packaged separately from the group of electrical components 501 that are packaged together. For example, a single package of an electrical device can have one or more "chiplets," each of which chiplets is placed into thermal contact with the evaporator (or an augmented thermal contact). In such an embodiment, one or more of the chiplets may be packaged under an integrated heat spreader (IHS) and the IHS can be placed into thermal contact with the evaporator (or the augmented thermal contact). Still further, one or more of the chiplets may have a bare die placed into thermal contact with the evaporator (or the augmented thermal contact). In some system embodiments, each of the electrical components is placed under an IHS, which is placed into thermal contact with the evaporator (or the augmented thermal contact). In some system embodiments, each of the electrical components has a bare die, which is placed into thermal contact with the evaporator (or the augmented thermal contact). In still other system embodiments, one or more of the electrical components is placed under an IHS, which is placed into thermal contact with the evaporator (or the augmented thermal contact), and one or more other of the electrical components has a bare die, which is placed into thermal contact with the evaporator (or the augmented thermal contact).

The evaporator is oriented in a manner that the liquid inlet 202 is positioned at an elevation (relative to gravity) above an elevation of the evaporator's vapor outlet 202. This elevation difference can aid in passively driving the flow of working fluid through the condenser 200.

Similarly, externally of the housing 510, the condenser 300 is positioned at an elevation (relative to gravity) above an elevation of the evaporator. This orientation allows the relatively less dense vapor phase to rise against gravity while allowing the relatively denser liquid phase to fall with gravity, further urging the self-sustained flow of working fluid through the loop thermosyphon 400. Additionally, the vapor inlet to the condenser 300 is positioned at a relatively higher elevation than the liquid outlet from the condenser, again, allowing gravity to aid in urging the working fluid throughout the loop thermosyphon.

As also shown in FIG. 31, the first segment 411 of the vapor conduit 410 and the first segment 421 of the liquid conduit 420 extend from the evaporator 200 to an interface boundary 511 defined by the electrical device 500. More particularly, in this embodiment, the fluid couplers 412, 423 are retained in place by the housing 510, which provides several advantages. For example, the electrical device 500 can maintain an environmentally sealed enclosure around the electrical components 501, protecting the components 501 (and other components of the system 500) from the environment 503. For example, the enclosure 510 can be an IP ("ingress protection") enclosure.

By retaining the fluid couplers 413, 423 at an interface boundary, the electrical device 500 can be manufactured and assembled in a factory, while permitting an installation technician later to complete assembly of the cooling system (e.g., the loop thermosyphon 400) by coupling the second segments 412, 422 with the first segments 411, 421, e.g., by coupling the second couplers 414, 424 with the first couplers 413, 423, respectively.

Figure 32:
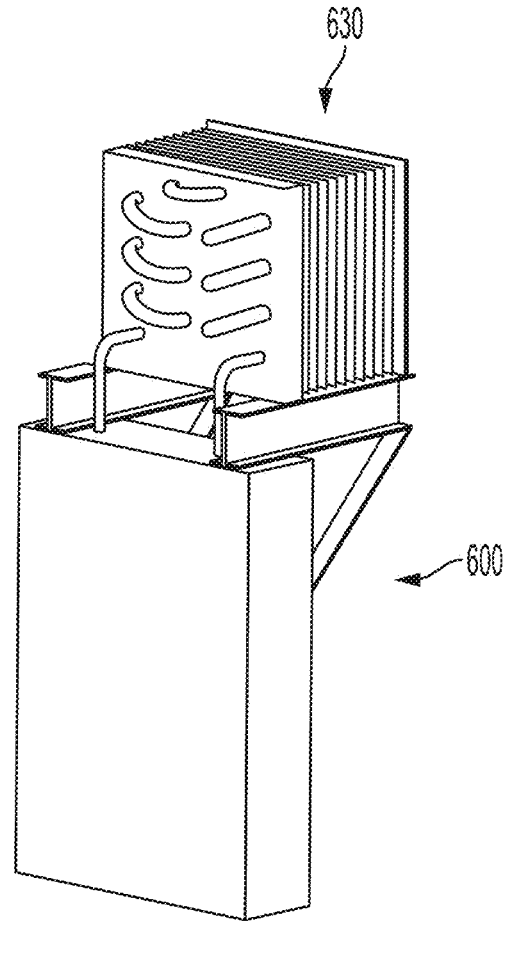
FIG. 32 shows another electrical device incorporating yet another embodiment of a loop thermosyphon.

FIG. 32 shows an isometric view of a rendering of a system 600 similar to that just described in relation to FIG. 31. The system 600 has two primary differences from that shown in FIG. 31: (1) the liquid and vapor conduits in FIG. 32 are of a continuous, non-segmented type; and (2) the condenser 630 is configured as a tube-fin heat exchanger rather than a condenser having internal manifold structures as described above in connection with FIGS. 26 through 29. The tube-and-fin type condenser conveys the vapor phase of the working fluid from the evaporator through a condenser coil. The external fins provide an extended heat-transfer surface from the condenser coil, allowing the working fluid to reject latent heat through the walls of the condenser coil, into the fins, and ultimately to another medium passing over the fins, e.g., environmental air. As the working fluid rejects latent heat, the vapor phase condenses to the liquid phase and flows down the liquid conduit, returning to the evaporator 200 within the chassis of the system 600.

VI.G. Other Loop Thermosyphon Embodiments

Figure 33:
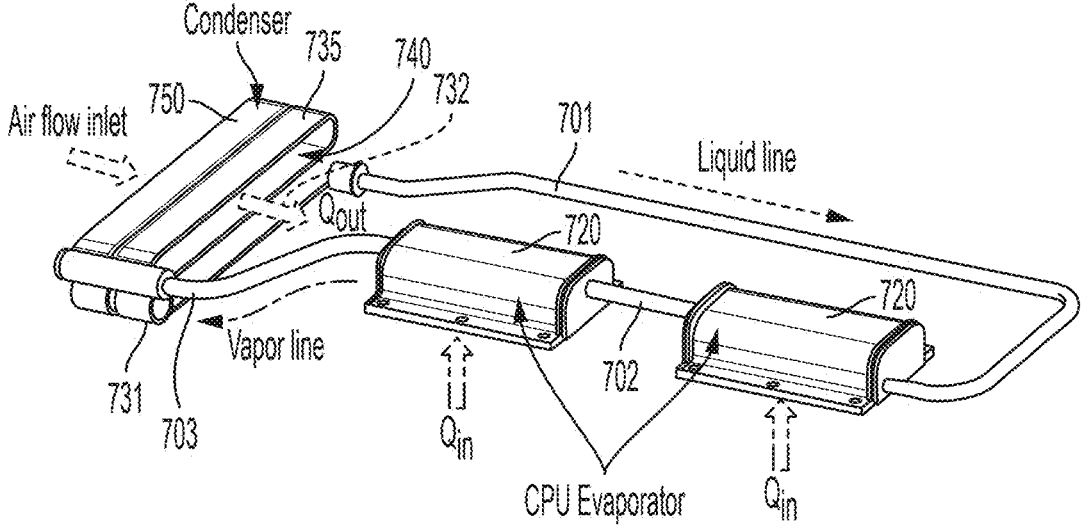
FIG. 33 shows yet another embodiment of a loop thermosyphon.

Referring again to FIGS. 17 and 18, the loop thermosyphon 100 has one evaporator and one condenser. However, a loop thermosyphon is not so limited. For example, referring to FIG. 33, a loop thermosyphon 700 is shown having a plurality of evaporators fluidly coupled with each other in series (i.e., working fluid that passes through one of the evaporators also passes through the other evaporator(s)

serially, one-at-a-time). For example, the working fluid enters the first evaporator 710, absorbing heat Qin and exhausting a saturated mixture of vapor and liquid to the first vapor line 702, which then enters the second evaporator 720 and absorbs further heat Qin. The vapor exhausts from the second evaporator 720 to the second vapor line 703 and flows into the condenser 730, where the working fluid rejects latent heat and condenses to the liquid phase, which flows through the liquid conduit back to the first evaporator 710. The condenser 730 can be configured similarly to the condenser 300, the condenser 630, or can be configured more similarly to a multi-pass radiator (e.g., an automotive radiator). A multi-pass-type condenser can have a flow-path 735 for the working fluid that sinuously winds back-and-forth between a proximal end positioned adjacent the vapor inlet 731 and a distal end positioned adjacent the liquid outlet 732. Between each leg of the flow-path 735, an array of corrugated or other fins 740 can extend outwardly from the flow path, providing an extended heat-transfer surface over which a heat-sink medium (e.g., air) can flow, removing latent heat from the working fluid and transferring that heat to the heat-sink medium. As the working fluid rejects the latent heat, it condenses to the liquid phase and flows through the liquid conduit 701.

VI. Other Embodiments

Embodiments described above generally concern one or more of metallic thermal-interface materials, some of which partially or wholly undergo phase transition within an expected range of operating temperatures, and apparatus, methods, and related systems to move heat from one medium to another using a loop thermosyphon. More particularly, but not exclusively, some disclosed principles pertain to systems, methods, and components to cool electrical or other heat-dissipating components using a passive heat-transfer loop, e.g., a loop thermosyphon As well, this disclosure pertains, more particularly but not exclusively, to devices and systems for transferring heat, e.g., for cooling heat-generating, electrical components, that incorporate such metallic thermal-interface materials.

Despite the description of certain details of loop thermosyphons, metallic thermal-interface materials, as well as heat-transfer components and electrical devices that incorporate them, the previous description is provided to enable a person skilled in the art to make or use the disclosed principles. Embodiments other than those described above in detail are contemplated based on the principles disclosed herein, together with any attendant changes in configurations of the respective apparatus or changes in order of method acts described herein, without departing from the spirit or scope of this disclosure. Various modifications to the examples described herein will be readily apparent to those skilled in the art.

For example, a loop thermosyphon can have more or fewer evaporators or condensers than the specific examples described above. Further, some conduits can include a flexible segment between substantially rigid segments, allowing some measure of installation flexibility.

Further, one particular example of an electrical device having components cooled by a loop thermosyphon was described for illustrative purposes. Nonetheless, other system configurations and types can be cooled or heated using a loop thermosyphon of the type described herein. For example, one or more electrical components in a 1U (or even a ½-U) server (or other electronic device, such as, for example, a 5G cellular radio, a power generation or transmission device) can be cooled by a loop thermosyphon as described herein. That is to say, even a small elevation difference provided by a ½-U server can be sufficient to urge a self-sustained, passive flow of a working fluid through a loop thermosyphon as described herein.

Many other types of electrical devices, such as, for example, a graphics processor, a television, power electronics devices, communications transmission devices and other networking devices, among others, have heat-dissipating devices that can be cooled by a passive loop thermosyphon as described. As but one particular example, one or more heat-dissipating components in a communications or other network device (e.g., a so-called 5 G transmission device) can be passively cooled with a loop thermosyphon as described. Similarly, some electrical storage batteries dissipate substantial amounts of heat while discharging or charging. For example, some batteries that can store substantial amounts of energy, e.g., a 5 kW-h to 50 kW-h battery, can be passively cooled with a loop thermosyphon as described.

By way of further example, heat-generating devices may be embodied other than as shown in FIG. 2. For example, a single package of an electrical device can have one or more "chiplets" rather than the single die 112 shown in FIG. 2. In such an embodiment, one or more of the chiplets may be packaged under an integrated heat spreader (IHS) and the IHS can be placed into thermal contact with a corresponding heat-transfer component. Still further, one or more of the chiplets may have a bare die placed into thermal contact with a heat-transfer component. In some embodiments, each heat-generating die or other component is placed under an IHS, which is placed into thermal contact with the heat-transfer component. In some embodiments, each heat-generating device has a bare die, which is placed into thermal contact with the heat-transfer component. In still other system embodiments, one or more of the heat-generating die or other components is placed under an IHS, which is placed into thermal contact with the heat-transfer component, and one or more other of the heat-generating device has a bare die, which is placed into thermal contact with the heat-transfer component.

Further alternative embodiments are possible. For example, the description above provides details of a thermal-interface material soldered to a heat-transfer component prior to assembly of the heat-transfer component with a heat-generating component. In other embodiments, the thermal-interface material can be soldered to an outer surface (e.g., surface 117 in FIG. 2) of an IHS (e.g., rather than to the base 122 of the heat-transfer component 120) prior to assembly of the heat-transfer component with the heat-generating component. In still other alternative embodiments, the primary thermal-interface material 118 can be soldered to an underside of the IHS prior to assembly of the IHS with the die 112 to achieve a similar manner of reduction or elimination of a thermal-contact resistance between the IHS and the 115 and the primary thermal-interface material 118 as is reduced or eliminated between the base 122 of the heat-transfer component 120 and the upper surface 111 by soldering the thermal-interface material 130 to the base 122.

Further, other system configurations and types incorporating metallic thermal-interface materials of the type described herein can be cooled or heated. For example, one or more electrical components in a 1U (or even a ½-U) server (or other electronic device, such as, for example, a 5G cellular radio, a power generation or transmission device) can be cooled by a heat-transfer device and a disclosed thermal-interface material can be applied within an interstitial gap between the heat-transfer device and the electrical component. Many other types of electrical devices, such as, for example, a graphics processor, a television, power electronics devices, communications transmission devices and other networking devices, among others, have heat-dissipating devices that can incorporate metallic thermal-interface materials as described. As but one particular example, one or more heat-dissipating components in a communications or other network device (e.g., a so-called 5 G transmission device) can be cooled by a heat-transfer device incorporating a pre-applied metallic TIM. Similarly, some electrical storage batteries dissipate substantial amounts of heat while discharging or charging. For example, some batteries that can store substantial amounts of energy, e.g., a 5 kW-h to 50 kW-h battery, can be cooled by a system that incorporates a metallic thermal-interface material as described.

Directions and other relative references (e.g., up, down, top, bottom, left, right, rearward, forward, etc.) may be used to facilitate discussion of the drawings and principles herein, but are not intended to be limiting. For example, certain terms may be used such as "up," "down,", "upper," "lower," "horizontal," "vertical," "left," "right," and the like. Such terms are used, where applicable, to provide some clarity of description when dealing with relative relationships, particularly with respect to the illustrated embodiments. Such terms are not, however, intended to imply absolute relationships, positions, and/or orientations. For example, with respect to an object, an "upper" surface can become a "lower" surface simply by turning the object over. Nevertheless, it is still the same surface, and the object remains the same. As used herein, "and/or" means "and" or "or", as well as "and" and "or." Moreover, all patent and non-patent literature cited herein is hereby incorporated by reference in its entirety for all purposes.

And, those of ordinary skill in the art will appreciate that the exemplary embodiments disclosed herein can be adapted to various configurations and/or uses without departing from the disclosed principles. Applying the principles disclosed herein, it is possible to provide a wide variety of loop thermosyphon devices and components thereof, metallic and composite thermal-interface materials and heat-transfer components incorporating such metallic and composite thermal-interface materials, as well as related methods and systems. For example, the principles described above in connection with any particular example can be combined with the principles described in connection with another example described herein. Thus, all structural and functional equivalents to the features and method acts of the various embodiments described throughout the disclosure that are known or later come to be known to those of ordinary skill in the art are intended to be encompassed by the principles described and the features and acts claimed herein. Accordingly, neither the claims nor this detailed description shall be construed in a limiting sense, and following a review of this disclosure, those of ordinary skill in the art will appreciate the wide variety of components, devices, systems, and related methods that can be devised using the various concepts described herein.

Moreover, nothing disclosed herein is intended to be dedicated to the public regardless of whether such disclosure is explicitly recited in the claims. No claim feature is to be construed under the provisions of 35 USC 112(f), unless the feature is expressly recited using the phrase "means for" or "step for".

The appended claims are not intended to be limited to the embodiments shown herein, but are to be accorded the full scope consistent with the language of the claims, wherein reference to a feature in the singular, such as by use of the article "a" or "an" is not intended to mean "one and only one" unless specifically so stated, but rather "one or more". Further, in view of the many possible embodiments to which the disclosed principles can be applied, we reserve the right to claim any and all combinations of features and technologies described herein as understood by a person of ordinary skill in the art, including the right to claim, for example, all that comes within the scope and spirit of the foregoing description, as well as the combinations recited, literally and equivalently, in any claims presented anytime throughout prosecution of this application or any application claiming benefit of or priority from this application, and more particularly but not exclusively in the claims appended hereto.

We claim:

1. A heat-transfer component comprising:
   a surface configured to be positioned at a thermal interface ("thermal-interface surface"); and
   a composite thermal-interface material comprising a metallic carrier material and a particulate filler material, the particulate filler material having a higher bulk thermal conductivity than the metallic carrier material, the composite thermal-interface material bonded to the thermal-interface surface, the metallic carrier material having a solidus-to-liquidus transition temperature between about 60° C. and about 90° C.;
   wherein the metallic carrier material is a non-eutectic mixture of Bismuth, Indium, Tin and Gallium; and
   wherein the metallic carrier has less than about 10% (weight) Gallium.

2. The heat-transfer component according to claim 1, wherein the particulate filler material comprises an alloy of copper.

3. A heat-transfer component comprising:
   a surface configured to be positioned at a thermal interface ("thermal-interface surface"); and
   a composite thermal-interface material comprising a metallic carrier material and a particulate filler material, the particulate filler material having a higher bulk thermal conductivity than the metallic carrier material, the composite thermal-interface material bonded to the thermal-interface surface, the metallic carrier material having a solidus-to-liquidus transition temperature between about 60° C. and about 90° C.;
   wherein the metallic carrier material is a non-eutectic mixture of Bismuth, Indium, Tin and Gallium; and
   wherein the solidus-to-liquidus transition temperature of the metallic carrier material is less than about 90° C. and the liquidus-to-solidus transition temperature of the metallic carrier material is above about 70° C.

4. The heat-transfer component according to claim 3, wherein the particulate filler material comprises an alloy of copper.

5. A heat-transfer component comprising:
   a surface configured to be positioned at a thermal interface ("thermal-interface surface"); and
   a composite thermal-interface material comprising a metallic carrier material and a particulate filler material, the particulate filler material having a higher bulk thermal conductivity than the metallic carrier material, the composite thermal-interface material bonded to the thermal-interface surface, the metallic carrier material having a solidus-to-liquidus transition temperature between about 60° C. and about 90° C., wherein:
   the heat-transfer component is an integrated heat spreader configured to overlie an integrated-circuit die, the thermal-interface surface is a first major surface of the integrated heat spreader, the integrated heat spreader defines a second major surface positioned opposite the thermal-interface surface, the second major surface is configured to face the integrated-circuit die, and the first major surface is configured to face a device configured to transfer heat from one medium to another medium ("heat-removal device").

6. The heat-transfer component according to claim 5, wherein the particulate filler material comprises an alloy of copper.

7. The heat-transfer component according to claim 5, wherein the metallic carrier material is a eutectic mixture of Bismuth, Indium, Tin and Gallium.

8. The heat-transfer component according to claim 7, wherein the solidus-to-liquidus transition temperature is about 60° C., about 70° C., about 80° C., or about 90° C.

9. A heat-transfer component comprising:

a surface configured to be positioned at a thermal interface ("thermal-interface surface"); and a composite thermal-interface material comprising a metallic carrier material and a particulate filler material, the particulate filler material having a higher bulk thermal conductivity than the metallic carrier material, the composite thermal-interface material bonded to the thermal-interface surface, the metallic carrier material having a solidus-to-liquidus transition temperature between about 60° C. and about 90° C., wherein:

the heat-transfer component is a device configured to transfer heat from one medium to another medium ("heat-removal device"), the heat-removal device being configured to dissipate heat received from heat-generating electronic component, the heat-removal device has a base and the thermal-interface surface being a first major surface of the base, the base further defining a second major surface opposite the first major surface, the heat-removal device further comprising a plurality of fins extending from the second major surface.

10. The heat-transfer component according to claim 9, wherein the metallic carrier material is a eutectic mixture of Bismuth, Indium, Tin and Gallium.

11. The heat-transfer component according to claim 10, wherein the solidus-to-liquidus transition temperature is about 60° C., about 70° C., about 80° C., or about 90° C.

12. The heat-transfer component according to claim 9, wherein the particulate filler material comprises an alloy of copper.

13. An electrical device comprising:

a heat-generating component defining a first surface configured to be positioned at a thermal interface ("thermal-interface surface");

a heat-transfer component defining a second thermal-interface surface; and a composite thermal-interface material bonded to the second thermal-interface surface, the composite thermal-interface material comprising a metallic carrier material and a particulate filler material, the metallic carrier material having a solidus-to-liquidus transition temperature between about 60° C. and about 90° C., wherein the metallic carrier material is a non-eutectic mixture of Bismuth, Indium, Tin and Gallium and has less than about 10% (weight) Gallium.

14. The electrical device according to claim 13, wherein the particulate filler material comprises an alloy of copper.

15. The electrical device according to claim 13, wherein the heat-generating component is an electronic processing unit, an electrical storage battery, or both.

16. An electrical device comprising:

a heat-generating component defining a first surface configured to be positioned at a thermal interface ("thermal-interface surface");

a heat-transfer component defining a second thermal-interface surface; and a composite thermal-interface material bonded to the second thermal-interface surface, the composite thermal-interface material comprising a metallic carrier material and a particulate filler material, the metallic carrier material having a solidus-to-liquidus transition temperature between about 60° C. and about 90° C., wherein:

the metallic carrier material is a non-eutectic mixture of Bismuth, Indium, Tin and Gallium, the solidus-to-liquidus transition temperature of the metallic carrier material is less than about 90° C. and the liquidus-to-solidus transition temperature of the metallic carrier material is above about 70° C.

17. The electrical device according to claim 16, wherein the heat-generating component is an electronic processing unit, an electrical storage battery, both.

18. An electrical device comprising:

a heat-generating component defining a first surface configured to be positioned at a thermal interface ("thermal-interface surface");

a heat-transfer component defining a second thermal-interface surface; and a composite thermal-interface material bonded to the second thermal-interface surface, the composite thermal-interface material comprising a metallic carrier material and a particulate filler material, the metallic carrier material having a solidus-to-liquidus transition temperature between about 60° C. and about 90° C., wherein:

the heat-transfer component is an integrated heat spreader configured to overlie an integrated-circuit die, the thermal-interface surface is a first major surface of the integrated heat spreader, the integrated heat spreader defines a second major surface positioned opposite the thermal-interface surface, the second major surface is configured to face the integrated-circuit die and the first major surface is configured to face a device configured to transfer heat from one medium to another medium ("heat-removal device").

19. The electrical device according to claim 18, wherein the metallic carrier material is a eutectic mixture of Bismuth, Indium, Tin and Gallium.

20. The electrical device according to claim 19, wherein the solidus-to-liquidus transition temperature is about 60° C., about 70° C., about 80° C., or about 90° C.

21. The electrical device according to claim 18, wherein the heat-generating component is an electronic processing unit, an electrical storage battery, or both.

22. The electrical device according to claim 18, wherein the metallic carrier material is a non-eutectic mixture of Bismuth, Indium, Tin and Gallium.

23. An electrical device comprising:

a heat-generating component defining a first surface configured to be positioned at a thermal interface ("thermal-interface surface");

a heat-transfer component defining a second thermal-interface surface; and a composite thermal-interface material bonded to the second thermal-interface surface, the composite thermal-interface material comprising a metallic carrier material and a particulate filler material, the metallic carrier material having a solidus-to-liquidus transition temperature between about 60° C. and about 90° C., wherein:

the heat-transfer component is a device configured to transfer heat from one medium to another medium ("heat-removal device") configured to dissipate heat received from heat-generating electronic component, the heat-removal device has a base and the thermal-interface surface is a first major surface of the base, the base further defines a second major surface opposite the first major surface, and the heat-removal device further comprises a plurality of fins extending from the second major surface.

24. The electrical device according to claim 23, wherein the metallic carrier material is a eutectic mixture of Bismuth, Indium, Tin and Gallium.

25. The electrical device according to claim 24, wherein the solidus-to-liquidus transition temperature is about 60° C., about 70° C., about 80° C., or about 90° C.

26. The electrical device according to claim 23, wherein the metallic carrier material is a non-eutectic mixture of Bismuth, Indium, Tin and Gallium.

27. The electrical device according to claim 23, wherein the heat-generating component is an electronic processing unit, an electrical storage battery, or both.

* * * * *